(12) United States Patent
Nakayama et al.

(10) Patent No.: US 7,924,098 B2
(45) Date of Patent: Apr. 12, 2011

(54) HIGH FREQUENCY AMPLIFIER CIRCUIT AND MOBILE COMMUNICATION TERMINAL USING THE SAME

(75) Inventors: Masao Nakayama, Ritto (JP); Tsunehiro Takagi, Nagaokakyo (JP); Masahiko Inamori, Ibaraki (JP); Kaname Motoyoshi, Nishinomiya (JP)

(73) Assignee: Panasonic Corporation, Osaka (JP)

( * ) Notice: Subject to any disclaimer, the term of this patent is extended or adjusted under 35 U.S.C. 154(b) by 25 days.

(21) Appl. No.: 12/572,346

(22) Filed: Oct. 2, 2009

(65) Prior Publication Data

US 2010/0022198 A1 Jan. 28, 2010

Related U.S. Application Data

(62) Division of application No. 11/754,914, filed on May 29, 2007, now Pat. No. 7,626,459, which is a division of application No. 10/880,553, filed on Jul. 1, 2004, now Pat. No. 7,239,205.

(30) Foreign Application Priority Data

Jul. 3, 2003 (JP) .................................. 2003-190754

(51) Int. Cl.
*H03F 3/04* (2006.01)
(52) U.S. Cl. ...... 330/305; 330/306; 330/284; 455/232.1; 455/234.1
(58) Field of Classification Search .................. 330/305, 330/306, 284, 149, 151, 291, 293; 455/232.1, 455/234.1
See application file for complete search history.

(56) References Cited

U.S. PATENT DOCUMENTS

| | | | |
|---|---|---|---|
| 4,890,077 A | 12/1989 | Sun | |
| 6,229,370 B1 | 5/2001 | Inamori et al. | |
| 6,337,974 B1 | 1/2002 | Inamori et al. | |
| 6,492,872 B1 | 12/2002 | Fujioka et al. | |
| 7,202,734 B1 * | 4/2007 | Raab | 330/126 |
| 7,501,897 B2 * | 3/2009 | Mori et al. | 330/302 |
| 2004/0174220 A1 * | 9/2004 | Toncich et al. | 330/305 |

FOREIGN PATENT DOCUMENTS

EP 0390120 10/1990

(Continued)

OTHER PUBLICATIONS

European Search Report dated Mar. 14, 2006.

(Continued)

*Primary Examiner* — Michael B Shingleton
(74) *Attorney, Agent, or Firm* — Dickinson Wright PLLC

(57) ABSTRACT

A first FET is inserted in a series position between a signal input terminal and a signal output terminal, while second and third FETs are inserted in a shunt position respectively between the signal input terminal and a ground terminal and between the signal output terminal and a ground terminal. First and second reference voltage terminals and a control terminal are provided. A first reference voltage and a control voltage are applied to the first FET, while a second reference voltage and a control voltage are applied respectively to the second and third FETs, so that the first, second, and third FETs serve as variable resistors. As such, a gain control circuit is constructed. Further, a first resistor is provided in parallel to the first FET, while second and third resistors are provided respectively in series to the second and third FETs.

15 Claims, 13 Drawing Sheets

FOREIGN PATENT DOCUMENTS

| | | |
|---|---|---|
| EP | 0797311 | 9/1997 |
| EP | 0993111 | 4/2000 |
| EP | 1058405 | 12/2000 |
| EP | 1357666 | 10/2003 |
| JP | 9135102 | 5/1997 |
| JP | 1155059 | 2/1999 |
| JP | 2000077963 | 3/2000 |
| JP | 2000341144 | 12/2000 |
| JP | 2001102881 | 4/2001 |
| JP | 2001217653 | 8/2001 |
| WO | 9832061 | 7/1998 |

OTHER PUBLICATIONS

M. Inamori, et al., "A New GaAs Variable-Gain Amplifier MMIC with a Wide-Dynamic-Range and Low-Voltage-Operation Linear Attenuation Circuit," IEEE Transactions on Microwave Theory and Techniques, vol. 48, No. 2, pp. 182-186, Feb. 2000.

H. J. Sun, et al., "A 2-18GHz Monolithic Variable Attenuator Using Novel Triple-Gate Mesfets," IEEE MTT-S Digest, vol. 2, XP000144078, pp. 777-780, May 8-10, 1990.

Japanese Office Action dated May 9, 2006 with English translation.

\* cited by examiner

HIGH FREQUENCY AMPLIFIER CIRCUIT AND MOBILE COMMUNICATION TERMINAL USING THE SAME

This is a divisional of application Ser. No. 11/754,914 filed May 29, 2007, which is a divisional of application Ser. No. 10/880,553 filed Jul. 1, 2004, which is based on JP 2003-190754 filed Jul. 3, 2003, the entire contents of each of which are incorporated by reference herein.

BACKGROUND OF THE INVENTION

1. Field of the Invention

The present invention relates to a high frequency amplifier circuit which is provided in a high frequency circuit section of a transmitting section of a mobile communication terminal so as to amplify a high frequency signal. The invention further relates to a mobile communication terminal using the high frequency amplifier circuit. The circuit addressed in the invention is such a high frequency amplifier circuit that the output power thereof is controlled by a control voltage.

2. Related Art of the Invention

Recently, in the field of mobile communication, combined portable telephone terminals where a plurality of communication schemes are integrated are entering into the mainstream of mobile communication terminals. An example of this is a mobile communication terminal that supports both PDC (Personal Digital Cellular) and W-CDMA (Wide band Code Division Multiple Access) schemes. Such a combined mobile communication terminal permit the use of the advantages in the respective schemes, such as the wideness of a service area in PDC and a high data communication rate in W-CDMA, and hence are expected to spread more rapidly in the future.

In such a combined mobile communication terminal, the PDC and W-CDMA schemes use carrier frequencies different from each other. Thus, two high frequency circuit blocks respectively for PDC and W-CDMA are necessary in the terminal. Further, for the purpose of size reduction in the mobile communication terminal, much attention is focused on the reduction in the number of components on the mobile communication terminal board and on the resulting size reduction in the high frequency circuit blocks.

Described below is a typical example of a prior art portable telephone terminal which supports a plurality of communication schemes such as PDC and W-CDMA.

FIG. 8 is a block diagram showing the configuration of a radio section of a typical example of a prior art portable telephone terminal. In FIG. 8, the radio section of the mobile communication terminal comprises a transmitting section 200, a receiving section 400, a synthesizer section 410, and a shared device section 500.

The transmitting section 200 comprises: an up converter 201 for converting an intermediate frequency modulation signal, that is, a modulation signal input having an intermediate frequency such as 600 MHz, into a transmission frequency signal; a variable gain high frequency amplifier circuit 202 for amplifying the output signal of the up converter 901 from 1 mW or lower into 10 mW or the like at maximum; a high frequency switch 203 for switching band pass filters to be used depending on the transmission frequency, that is, for switching the signal path; band pass filters 204 and 207 each for extracting a signal in one of two transmission bands; a high power high frequency amplifier circuit 205 having a fixed gain so as to amplify the high frequency signal output of the band pass filter 204 from 10 mW or lower into 1 W or the like at maximum; an isolator 206 for providing the output of the high power high frequency amplifier circuit 205 to the shared device section 500; a high power high frequency amplifier circuit 208 having a fixed gain so as to amplify the high frequency signal output of the band pass filter 207 from 10 mW or lower into 1 W or the like at maximum; and an isolator 209 for providing the output of the high power high frequency amplifier circuit 208 to the shared device section 500. The above-mentioned transmission frequency is approximately 900 MHz in PDC and approximately 1.9 GHz in W-CDMA.

The receiving section 400 comprises: a front end IC 401 for amplifying the reception signal received in the shared device section 500 and then mixing this reception signal with a local oscillation signal provided from the synthesizer section 410; and a band pass filter 402 for extracting an intermediate frequency signal from the output signal of the front end IC 401.

The synthesizer section 410 comprises a temperature compensated crystal oscillator (TCXO) 411, a phase locked loop (PLL) circuit 412, and a voltage controlled oscillator (VCO) 413.

The shared device section 500 comprises antennas 501 and 502 and a duplexer 503.

In order that a plurality of communication schemes such as PDC and W-CDMA are supported and that the overall high frequency circuit block of the mobile communication terminal is miniaturized, the up converter 201 and the high frequency amplifier circuit 202 are shared. Nevertheless, as for the band pass filters 204 and 207, the high power high frequency amplifier circuits 205 and 208, and the isolators 206 and 209, these circuit blocks need to be provided in correspondence to the respective communication frequencies. Further, the high frequency switch 203 is necessary for selecting circuit blocks corresponding to the communication frequency.

FIG. 9 is a block diagram of the radio section of the typical example of a prior art portable telephone terminal shown in FIG. 8. That is, FIG. 9 is a block diagram showing detailed configuration of the transmitting section 200 and the shared device section 500.

In FIG. 9, an intermediate frequency modulation signal generated by modulating a voice signal or the like is inputted to a signal input terminal 101. The up converter 103 receives through the signal input terminal 10 the intermediate frequency modulation signal generated by modulating a voice signal or the like, and at the same time receives a local oscillation signal from an oscillator 102 so as to convert the intermediate frequency signal into a transmission frequency signal. More specifically, the up converter 103 mixes the signal having the intermediate frequency (the intermediate frequency modulation signal) with the local oscillation signal provided from the oscillator 102 so as to convert the intermediate frequency signal into the transmission frequency signal.

Here, the frequency of the intermediate frequency modulation signal inputted to the up converter 103 is denoted by fif. The local oscillation frequency of the oscillator 102 is denoted by flo. The frequency of the transmission signal is denoted by fc. Then, the frequency fc of the transmission signal is expressed by the following equation, and is outputted as a frequency fc from the up converter 103.

$$fc = flo \pm fif$$

When the oscillation frequency of the oscillator 102 is adjusted, transmission waves can be synthesized in correspondence to a plurality of transmission frequencies for the PDC and W-CDMA schemes or the like.

A high frequency amplifier circuit 104 is provided with a gain control function, and amplifies the signal having the transmission frequency into 10 mW or the like at maximum. A high frequency switch 105 is used for selecting high frequency circuits corresponding to the communication frequency.

In the PDC scheme, a band pass filter 106, a high power high frequency amplifier circuit 107, and an isolator 108 are used as the above-mentioned high frequency circuits. In the W-CDMA scheme, a band pass filter 109, a high power high frequency amplifier circuit 110, and an isolator 111 are used as the above-mentioned high frequency circuits.

In the PDC scheme, the output signal of the high frequency amplifier circuit 104 is transmitted from a terminal 105a of the high frequency switch 105 to a terminal 105b thereof so as to be inputted to the band pass filter 106. From the signal Inputted to the band pass filter 106, the band pass filter 106 extracts a signal in the transmission band. Then, the signal is outputted from the band pass filter 106. The high power high frequency amplifier circuit 107 amplifies the output signal of the band pass filter 106, which is a signal having the transmission frequency, into 1 W or the like at maximum. The output of the high power high frequency amplifier circuit 107 is provided through the isolator 108 to a terminal 112a of a duplexer 112.

In the W-CDMA scheme, the output signal of the high frequency amplifier circuit 104 is transmitted from a terminal 105a of the high frequency switch 105 to a terminal 105c thereof so as to be inputted to the band pass filter 109. From the signal inputted to the band pass filter 109, the hand pass filter 109 extracts a signal in the transmission band. Then, the signal is outputted from the bandpass filter 109. The high power high frequency amplifier circuit 110 amplifies the output signal of the band pass filter 109, which is a signal having the transmission frequency, into 1 W or the like at maximum. The output of the high power high frequency amplifier circuit 110 is provided through the isolator 111 to a terminal 112b of the duplexer 112.

The duplexer 112 has the functions of: transmitting to an antenna 113 the transmission signal outputted from the isolator 108; transmitting to a signal output terminal 115 a reception signal received in the antenna 113; transmitting to an antenna 114 the transmission signal outputted from the isolator 111; and transmitting to a signal output terminal 116 a reception signal received in the antenna 114.

As such, in the high frequency circuit block of FIG. 9, the antennas are used selectively depending on the communication schemes. That is, the antenna 113 is used in the PDC scheme, while the antenna 114 is used in the W-CDMA scheme.

More specifically, the duplexer 112 has the functions of: passing the signal in the direction from the terminal 112a to the terminal 112c; blocking the signal in the directions from the terminal 112a to the terminals 112b, 112d, 112e, and 112f; passing the signal in the direction from the terminal 112b to the terminal 112d; blocking the signal in the directions from the terminal 112b to the terminals 112a, 112c, 112e, and 112f; passing the signal in the direction from the terminal 112c to the terminal 112e; blocking the signal in the directions from the terminal 112c to the terminals 112a, 112b, 112d, and 112; passing the signal in the direction from the terminal 112d to the terminal 112f; blocking the signal in the directions from the terminal 112d to the terminals 112a, 112b, 112c, and 112e; blocking the signal in the directions from the terminal 112e to the terminals 112a, 112b, 112c, 112d, and 112f; and blocking the signal in the directions from the terminal 112f to the terminals 112a, 112b, 112c, 112d, and 112e.

The prior art portable telephone terminal has used the configuration of FIG. 9, so that the high frequency circuit blocks are miniaturized in a communication terminal in which the high frequency switch 105 selects a high frequency circuit so as to support a plurality of communication schemes.

Described next is a high frequency amplifier circuit which supports a plurality of communication schemes such as PDC and W-CDMA. FIG. 10 is a detailed circuit block diagram showing the high frequency amplifier circuit 104 of FIG. 9.

As shown in FIG. 10, in the high frequency amplifier circuit 104, a high frequency signal inputted through a signal input terminal 181 is provided to a gain control circuit 183 via an impedance matching circuit 182 for impedance transformation. The output signal of the gain control circuit 183 is provided to and amplified by an amplifier 184. The output signal of the amplifier 184 is provided to and amplified by an amplifier 186 via an impedance matching circuit 185 for impedance transformation. The output signal of the amplifier 186 is transmitted to a signal output terminal 188 via an impedance matching circuit 187 for impedance transformation.

Described below is the gain control operation using the high frequency amplifier circuit 104. The amount of attenuation in the gain control circuit of the high frequency amplifier circuit 104 is controlled by the setting of the voltage value on a control terminal 189. The voltage on the control terminal 189 is controlled using a D/A converter. The D/A converter sets this voltage on the control terminal 189 in response to a control signal from a controlling section.

FIG. 11 shows the relation between the control voltage and the output power in the above-mentioned high frequency amplifier circuit 104 of FIG. 9. Here, the input power to the high frequency amplifier circuit 104 is maintained at constant. As seen from FIG. 11, the output power of the high frequency amplifier circuit of FIG. 9 varies depending on the change in the control voltage. When the high frequency amplifier circuit 104 is used as the transmission block in the radio section of the mobile communication terminal of FIG. 8, this circuit permits output power control for the transmission power of the mobile communication terminal.

Described below is the gain control circuit used in the high frequency circuit block of the mobile communication terminal.

The gain control circuit in the high frequency circuit block is constructed from field effect transistors (FETs, hereafter). That is, in the prior art, FETs have been used as variable resistors, so as to implement the gain control circuit.

An example of such a prior art gain control circuit is described in JP-A-H09-135102 (page 5 and FIGS. 1 and 2).

FIG. 12 shows a prior art gain control circuit described in this JP-A-H09-135102. In FIG. 12, numeral 1 indicates a first FET. Numeral 2 indicates a second FET. Numeral 3 indicates a third FET. Numeral 4a indicates a first resistor connected in series to the first FET 1. Numeral 4b indicates a second resistor connected in series to the second FET 2. Numeral 4c indicates a third resistor connected in parallel to the third FET 3. Numeral 5 indicates the ground. Numeral 6a indicates an input terminal. Numeral 6b indicates an output terminal. Numeral 7a indicates a first series circuit. Numeral 7b indicates a second series circuit.

The operation of the gain control circuit is described below with reference to FIG. 12. When the voltage applied on the gate terminal of an FET is controlled, the FET is controlled between its ON and OFF states. When the FET is ON, the FET has a low impedance, and passes a signal. When the FET is OFF, the FET has a high impedance, and blocks a signal component.

Thus, when the first FET 1 and the second FET 2 are OFF and when the third FET 3 is ON, in an equivalent circuit to the gain control circuit, the first FET 1 and the second FET 2 serve as open ends relative to the input 6*a* and the output 6*b*, while the third FET 3 serves as a sufficiently small resistance. This equivalent circuit is shown in FIG. 13A. The circuit serves as a passage circuit.

When the first FET 1 and the second FET 2 are ON and when the third FET 3 is OFF, in an equivalent circuit to the gain control circuit, the first FET 1 and the second FET 2 serve as resistance components, while the third FET 3 has a high impedance and is open. This equivalent circuit is shown in FIG. 13B. The circuit is a n-type attenuator composed of the first resistor 4*a*, the second resistor 4*b*, and the third resistor 4*c*.

In the prior art, the gain control circuit has been implemented by such circuit configuration.

A first problem is that in the gain control circuit according to the prior art, two kinds of control signals are necessary for controlling the gain control circuit, and hence causes complexity in the control circuit.

This is because a control voltage needs to be provided to the gate terminals of the first FET 1 and the second FET 2 constituting the gain control circuit, and because another control voltage needs to be provided to the gate terminal of the third FET 3 also constituting the gain control circuit. Thus, D/A converters for converting a control signal for gain control into analog signals are necessary for the respective gate terminals. This increases the circuits size of the high frequency circuit block.

A second problem is that in the gain control circuit according to the prior art, the gain control circuit can merely take two states having a low impedance and a high impedance.

This is because the voltage provided to the gate terminals of the first FET 1 and the second FET 2 constituting the gain control circuit and the other voltage provided to the gate terminal of the third FET 3 also constituting the gain control circuit are controlled individually, so that the FETs 1-3 are switched between ON and OFF, so that the gain control is achieved. That is, in the low impedance state, the first FET 1 and the second FET 2 are set OFF, while the third FET 3 is set ON. In the high impedance state, the first FET 1 and the second FET 2 are set ON and when the third FET 3 is set OFF. As such, the gain control is performed.

Thus, the amount of attenuation in the gain control circuit cannot take the other value than the two in the low impedance state and the high impedance state.

A third problem is that when a high frequency amplifier circuit supporting a plurality of communication schemes is constructed, the relation between the gain control voltage and the amount of attenuation in the gain control circuit varies depending on the communication scheme because of the frequency characteristics of the gain control circuit.

This is because the FETs constituting the gain control circuit have frequency characteristics, and hence the transmission characteristics between the source terminal and the drain terminal varies depending on the frequency.

A fourth problem is that when a gain control circuit used in a high frequency amplifier circuit supporting a plurality of communication schemes and having different frequencies depending on the communication schemes is constructed, a D/A converter connected to a control terminal needs a higher resolution in the output voltage in case that the control voltage and the gain control characteristics vary depending on the frequency.

This is because when a high frequency amplifier circuit supporting a plurality of communication schemes is constructed, the relation between the gain control voltage and the amount of attenuation in the gain control circuit varies depending on the communication scheme. Thus, the resolution of the D/A converter needs to be sufficiently high in correspondence to a communication scheme having the largest ratio of the amount of attenuation in the gain control circuit to the control voltage. This causes an increase in the circuit size of the D/A converter in the control circuit and in the number of the control parameters for the gain control voltage and the amount of attenuation used for controlling the gain control circuit. This causes complexity in the control circuit.

SUMMARY OF THE INVENTION

An object of the invention is to provide: a high frequency amplifier circuit in which the range of gain control setting in a gain control circuit is expanded, and in which a plurality of communication schemes are supported, and further in which the size of the control circuit is reduced and the control method is simplified; and a mobile communication terminal using the same.

A first high frequency amplifier circuit according to the invention comprises: a signal input terminal (231) and a signal output terminal (232); a first variable resistor circuit (260) connecting the signal input terminal (231) to the signal output terminal (232); a second variable resistor circuit (261) connected in parallel to the signal input terminal (231) and a first ground terminal (236); a third variable resistor circuit (262) connected in parallel to the signal output terminal (232) and a second ground terminal (237); a control terminal (233) connected respectively to the first, second, and third variable resistor circuits (260, 261, and 262); a first reference voltage terminal (234) connected to the first variable resistor circuit (260); and a second reference voltage terminal (235) connected to the second and third variable resistor circuits (261 and 262).

In this circuit, the DC resistance between the signal input terminal (231) and the signal output terminal (232) is infinity. The DC resistance between the signal input terminal (231) and the first ground terminal (236) is infinity. The DC resistance between the signal output terminal (232) and the second ground terminal (237) is infinity.

Then, on the basis of the relation between the voltage of the control terminal (233), the voltage of the first reference voltage terminal (234), and the voltage of the second reference voltage terminal (235), the resistance values of the first, second, and third variable resistor circuits (260, 261, and 262) are adjusted continuously, so that the signal level on the signal output terminal (232) is continuously adjusted relative to the signal level inputted to the signal input terminal (231).

As for the second and third variable resistor circuits (261 and 262), any one of these may be provided, while the other may be omitted.

According to the first high frequency amplifier circuit of the invention, on the basis of the relation between the voltage of the control terminal (233), the voltage of the first reference voltage terminal (234), and the voltage of the second reference voltage terminal (235), the resistance values of the first, second, and third variable resistor circuits (260, 261, and 262) are adjusted continuously, so that the signal level on the signal output terminal (232) is continuously adjusted relative to the signal level inputted to the signal input terminal (231) whereby a control voltage is adjusted, so that the gain of the high frequency amplifier circuit is adjusted continuously. Thus, when the control voltage is adjusted, the gain of the high frequency amplifier circuit is adjusted continuously.

Further, according to this configuration, the circuit configuration of the first, second, and third variable resistor circuits (260, 261, and 262) of the gain control circuit can be selected depending on the required characteristics. This permits flexible design of the gain control circuit of the high frequency amplifier circuit.

The above-mentioned first variable resistor circuit (260) comprises a first FET (240). The control terminal (233) is connected through at least one or more first resistors (255) to the gate terminal of the first FET (240). The first reference voltage terminal (234) is connected through at least one or more second resistors (239) to the source terminal or the drain terminal of the first FET (240). A third resistor (241) is connected between the source terminal and the drain terminal of the first FET (240).

According to this configuration, on the basis of the relation between the voltage of the control terminal (233) and the voltage of the first reference voltage terminal (234), the resistance between the source terminal and the drain terminal of the first FET (240) serves as a variable resistor.

The above-mentioned second variable resistor circuit (261) comprises a second FET (245). The control terminal (233) is connected through at least one or more fourth resistors (259) to the source terminal or the drain terminal of the second FET (245). The second reference voltage terminal (235) is connected through at least one or more fifth resistors (257) to the gate terminal of the second FET (245). A sixth resistor (246) is connected between the source terminal and the drain terminal of the second FET (245). Seventh resistors (244 and 247) are connected at least at one of a position between the signal input terminal (231) and the source terminal or the drain terminal of the second FET (245) and a position between the first ground terminal (236) and the drain terminal or the source terminal of the second FET (245).

According to this configuration, on the basis of the relation between the voltage of the control terminal (233) and the voltage of the second reference voltage terminal (235), the resistance between the source terminal and the drain terminal of the second FET (245) serves as a variable resistor.

The above-mentioned third variable resistor circuit (262) comprises a third FET (251). The control terminal (233) is connected through at least one or more eighth resistors (256) to the source terminal or the drain terminal of the third FET (251). The second reference voltage terminal (235) is connected through at least one or more ninth resistors (258) to the gate terminal of the third FET (251). A tenth resistor (252) is connected between the source terminal and the drain terminal of the third FET (251). Eleventh resistors (250 and 253) are connected at least at one of a position between the signal output terminal (232) and the source terminal or the drain terminal of the third FET (251) and a position between the second ground terminal (237) and the drain terminal or the source terminal of the third FET (251).

According to this configuration, on the basis of the relation between the voltage of the control terminal (233) and the voltage of the second reference voltage terminal (235), the resistance between the source terminal and the drain terminal of the third FET (251) serves as a variable resistor.

The above-mentioned first FET (240) comprises a source electrode and a drain electrode, and further comprises at least one or more gate electrodes between the source electrode and the drain electrode. The second and third FETs (245 and 251) are similar to this.

According to this configuration, without the necessity of increasing the gate width of the first, second, and third FETs (240, 245, and 251), distortion characteristics is improved for the signal level inputted to the first, second, and third FETs (240, 245, and 251).

The resistance value of the third resistor (241) connected between the source terminal and the drain terminal of the first FET (240) is lower than the off resistance value between the source terminal and the drain terminal of the first FET (240).

This configuration reduces frequency dependent variation in the passage characteristics between the source terminal and the drain terminal of the first FET (240).

The sum of the resistance values of the seventh resistors (244 and 247) connected at least at one of a position between the signal input terminal (231) and the source terminal or the drain terminal of the second FET (245) and a position between the first ground terminal (236) and the drain terminal or the source terminal of the second FET (245) is higher than the on resistance value between the source terminal and the drain terminal of the second FET (245).

This configuration reduces frequency dependent variation in the passage characteristics between the source terminal and the drain terminal of the second FET (245).

The sum of the resistance values of the eleventh resistors (250 and 253) connected at least at one of a position between the signal output terminal (232) and the source terminal or the drain terminal of the third FET (251) and a position between the second ground terminal (237) and the drain terminal or the source terminal of the third FET (251) is higher than the on resistance value between the source terminal or the drain terminal of the third FET (251).

This configuration reduces frequency dependent variation in the passage characteristics between the source terminal and the drain terminal of the third FET (251).

A second high frequency amplifier circuit according to the invention comprises: a signal input terminal (211) and a signal output terminal (219); a first matching circuit (212) an input terminal of which is connected to the signal input terminal (211); a gain control circuit (213) an input terminal of which is connected to an output terminal of the first matching circuit (212); a first amplifier (215) an input terminal of which is connected to an output terminal of the gain control circuit (213); a second matching circuit (216) an input terminal of which is connected to an output terminal of the first amplifier (215); a second amplifier (217) an input terminal of which is connected to an output terminal of the second matching circuit (216); a third matching circuit (218) an input terminal of which is connected to an output terminal of the second amplifier (217), and an output terminal of which is connected to the signal output terminal (219); a reference voltage terminal (221); a reference voltage circuit (214) a reference voltage input terminal (214a) of which is connected to the reference voltage terminal (221), and a plurality of reference voltage output terminals (214b and 214c) of which are connected respectively to a plurality of reference voltage input terminals (213b and 213c) of the gain control circuit (213); a control terminal (220) connected to a control input terminal (213a) of the gain control circuit (213); first ground terminals (224 and 225) connected to ground terminals (213d and 213e) of the gain control circuit (213); a first supply terminal (222) connected to a supply terminal of the first amplifier (215); a second ground terminal (226) connected to a ground terminal of the first amplifier (215); a second supply terminal (223) connected to a supply terminal of the second amplifier (217); and a third ground terminal (227) connected to a ground terminal of the second amplifier (217).

In this circuit, on the basis of the relation between the voltage of the reference voltage input terminal (221) and the voltage of the control terminal (220), the resistance value between the signal input terminal and the signal output terminal of the gain control circuit (213) is adjusted, so that the signal level on the signal output terminal (219) is continuously adjusted relative to the signal level inputted to the signal input terminal (211).

According to the second high frequency amplifier circuit of the invention, on the basis of the relation between the voltage of the reference voltage input terminal (221) and the voltage of the control terminal (220), the resistance value between the signal input terminal and the signal output terminal of the gain control circuit (213) is adjusted, so that the signal level on the signal output terminal (219) is continuously adjusted relative to the signal level inputted to the signal input terminal (211). This configuration permits a single control voltage to adjust the gain of the high frequency amplifier circuit, and hence simplifies the control circuit in the high frequency circuit block.

The gain control circuit (213) comprises a variable resistor circuit constructed from an FET.

According to this configuration, the relation between the voltage on the source terminal or the drain terminal of the FET and the voltage on the gate terminal is controlled, so that the resistance between the source terminal and the drain terminal of the FET serves as a variable resistor.

The reference voltage terminal (221) is connected either to the first supply terminal (222) or to the second supply terminal (223).

According to this configuration, the reference voltage terminal of the reference voltage circuit and the supply terminal of the first amplifier (215) or the supply terminal of the second amplifier (217) are shared, so that the number of terminals is reduced in the high frequency amplifier circuit.

In the configuration of the gain control circuit, a first variable resistor circuit constructed from an FET may be provided between the signal input terminal and the signal output terminal. A second variable resistor circuit constructed from an FET may be provided between the signal input terminal and the ground terminal. A third variable resistor circuit constructed from an FET may be provided between the signal output terminal and the ground terminal. Further, a first reference voltage to be applied to the first variable resistor circuit and a second reference voltage to be applied to the second and third variable resistor circuits may be provided.

This configuration allows the first through third variable resistor circuits to operate in a state that the operation range of the first variable resistor circuit, and the operation ranges of second and third variable resistor circuits are shifted relative to the control voltage. This expands the range of the control voltage. As for the second and third variable resistor circuits, it is not necessary to provide the both. When any one of these is provided, the above-mentioned effect is obtained.

Further, a resistor may be connected between the source terminal and the drain terminal of the FET of the first variable resistor circuit. A resistor may be connected either between the source terminal or the drain terminal of the FET of the second variable resistor circuit and the signal input terminal or between the drain terminal or the source terminal of the FET of the second variable resistor circuit and the ground terminal. A resistor may be connected either between the source terminal or the drain terminal of the FET of the third variable resistor circuit and the signal output terminal or between the drain terminal or the source terminal of the FET of the third variable resistor circuit and the ground terminal. This configuration notably reduces frequency dependent variation in the gain control characteristics between the voltage of the control terminal and the amount of attenuation in the gain control circuit.

A third high frequency amplifier circuit according to the invention comprises: a signal input terminal (291) and a signal output terminal (292); a first variable resistor circuit (325) connecting the signal input terminal (291) to the signal output terminal (292); a second variable resistor circuit (326) connected in parallel to the signal input terminal (291) and a first ground terminal (296); third variable resistor circuit (327) connected in parallel to the signal output terminal (292) and a second ground terminal (297); a first voltage divider circuit (328) which is connected between a control terminal (293) and a third ground terminal (298) and an output terminal of which is connected to the first variable resistor circuit (325); a second voltage divider circuit (329) which is connected between the control terminal (293) and the third ground terminal (298) and an output terminal of which is connected respectively to the second and third variable resistor circuits (326 and 327); a first reference voltage terminal (294) connected to the first variable resistor circuit (325); and a second reference voltage terminal (295) connected to the second and third variable resistor circuits (326 and 327).

In this circuit, the DC resistance between the signal input terminal (291) and the signal output terminal (292) is infinity. The DC resistance between the signal input terminal (291) and the first ground terminal (296) is infinity. The DC resistance between the signal output terminal (292) and the second ground terminal (297) is infinity.

Then, on the basis of the relation between the voltage of the control terminal (293), the voltage of the first reference voltage terminal (294), and the voltage of the second reference voltage terminal (295), the resistance values of the first, second, and third variable resistor circuits (325, 326, and 327) are adjusted continuously, so that the signal level on the signal output terminal (292) is continuously adjusted relative to the signal level inputted to the signal input terminal (291).

As for the second and third variable resistor circuits (326 and 327), any one of these ray be provided, while the other may be omitted.

According to the third high frequency amplifier circuit of the invention, on the basis of the relation between the voltage of the control terminal (293), the voltage of the first reference voltage terminal (294), and the voltage of the second reference voltage terminal (295), the resistance values of the first, second, and third variable resistor circuits (325, 326, and 327) are adjusted continuously, so that the signal level on the signal output terminal (292) is continuously adjusted relative to the signal level inputted to the signal input terminal (291).

Further, according to this configuration, the circuit configuration of the first, second, and third variable resistor circuits (325, 326, and 327) of the gain control circuit can be selected depending on the required characteristics. This permits flexible design of the gain control circuit of the high frequency amplifier circuit.

Furthermore, according to this configuration, the voltage on the control terminal (293) is divided by the first voltage divider circuit (328) and the second voltage divider circuit (329), and then provided to the first, second, and third variable resistor circuits (325, 326, and 327). This allows the gain of the high frequency amplifier circuit to be adjusted continuously across a wider range of the control voltage.

The above-mentioned first variable resistor circuit (325) comprises a first FET (301), while the first voltage divider circuit (328) comprises at least two first resistors (316 and 317). The control terminal (293) is connected to the first voltage divider circuit (328), while the output terminal of the first voltage divider circuit (328) is connected through at least one or more second resistors (318) to the gate terminal of the first FET (301). The first reference voltage terminal (294) is connected through at least one or more third resistors (300) to the source terminal or the drain terminal of the first FET (301). A fourth resistor (302) is connected between the source terminal and the drain terminal of the first FET (301).

According to this configuration, the voltage on the control terminal (293) is divided by the first voltage divider circuit (328), and then provided to the first variable resistor circuit (325). Then, on the basis of the relation between the voltage of the control terminal (293) and the voltage of the first reference voltage terminal (294), the resistance between the source terminal and the drain terminal of the first FET (301) serves as a variable resistor. This permits further expansion of the setting range of the control voltage.

The abovementioned second variable resistor circuit (326) comprises a second FET (306), while the second voltage divider circuit (329) comprises at least two fifth resistors (319 and 320). The control terminal (293) is connected to the second voltage divider circuit (329), while the output terminal of the second voltage divider circuit (329) is connected through at least one or more sixth resistors (321) to the source terminal or the drain terminal of the second FET (306). The second reference voltage terminal (295) is connected through at least one or more seventh resistors (323) to the gate terminal of the second FET (306). An eighth resistor (307) is connected between the source terminal and the drain terminal of the second FET (306). Ninth resistors (305 and 308) are connected at least at one of a position between the signal input terminal (291) and the source terminal or the drain terminal of the second FET (306) and a position between the first ground terminal (296) and the drain terminal or the source terminal of the second FET (306).

According to this configuration, the voltage on the control terminal (293) is divided by the second voltage divider circuit (329), and then provided to the second variable resistor circuit (326). Then, on the basis of the relation between the voltage of the control terminal (293) and the voltage of the second reference voltage terminal (295), the resistance between the source terminal and the drain terminal of the second FET (306) serves as a variable resistor. This permits further expansion of the setting range of the control voltage.

The above-mentioned third variable resistor circuit (327) comprises a third FET (312), while the second voltage divider circuit (329) comprises at least two fifth resistors (319 and 320). The control terminal (293) is connected to the second voltage divider circuit (329), while the output terminal of the second voltage divider circuit (329) is connected through at least one or more tenth resistors (322) to the source terminal or the drain terminal of the third FET (312). The second reference voltage terminal (295) is connected through at least one or more eleventh resistors (324) to the gate terminal of the third FET (312). A twelfth resistor (313) is connected between the source terminal and the drain terminal of the third FET (312). Thirteenth resistors (311 and 314) are connected at least at one of a position between the signal output terminal (292) and the source terminal or the drain terminal of the third FET (312) and a position between the second ground terminal (297) and the drain terminal or the source terminal of the third FET (312).

According to this configuration, the voltage on the control terminal (293) is divided by the second voltage divider circuit (329) and then provided to the third variable resistor circuit (327). Then, on the basis of the relation between the voltage of the control terminal (293) and the voltage of the second reference voltage terminal (295), the resistance between the source terminal and the drain terminal of the third FET (312) serves as a variable resistor. This permits further expansion of the setting range of the control voltage.

The first FET (301) comprises a source electrode and a drain electrode, and further comprises at least one or more gate electrodes between the source electrode and the drain electrode. The second and third FETs (306 and 312) are similar to this.

According to this configuration, without the necessity of increasing the gate width of the first, second, and third FETs (301, 306, and 312), distortion characteristics is improved for the signal level inputted to the FETs.

The resistance value of the fourth resistor (302) connected between the source terminal and the drain terminal of the first FET (301) is value lower than the off resistance value between the source terminal and the drain terminal of the first FET (301).

This configuration reduces frequency dependent variation in the passage characteristics between the source terminal and the drain terminal of the first FET (301).

The sum of the resistance values of the ninth resistors (305 and 308) connected at least at one of a position between the signal input terminal (291) and the source terminal or the drain terminal of the second FET (306) and a position between the first ground terminal (296) and the drain terminal or the source terminal of the second FET (306) is higher than the on resistance value between the source terminal and the drain terminal of the second FET (306).

This configuration reduces frequency dependent variation in the passage characteristics between the source terminal and the drain terminal of the second FET (306).

The sum of the resistance values of the thirteenth resistors (311 and 314) connected at least at one of a position between the signal output terminal (292) and the source terminal or the drain terminal of the third FET (312) and a position between the second ground terminal (297) and the drain terminal or the source terminal of the third FET (312) is higher than the on resistance value between the source terminal or the drain terminal of the third FET (312).

This configuration reduces frequency dependent variation in the passage characteristics between the source terminal and the drain terminal of the third FET (312).

A fourth high frequency amplifier circuit according to the invention comprises: a signal input terminal (271) and a signal output terminal (279); a first matching circuit (272) an input terminal of which is connected to the signal input terminal (271); a gain control circuit (273) which has a voltage divider circuit for dividing again control voltage, and an input terminal of which is connected to an output terminal of the first matching circuit (272); a first amplifier (275) an input terminal of which is connected to an output terminal of the gain control circuit (273); a second matching circuit (276) an input terminal of which is connected to an output terminal of the first amplifier (275); a second amplifier (277) an input terminal of which is connected to an output terminal of the second matching circuit (276); a third matching circuit (278) an input terminal of which is connected to an output terminal of the second amplifier (277), and an output terminal of which is connected to the signal output terminal (279); a reference voltage terminal (281); a reference voltage circuit (274) a reference voltage input terminal (274a) of which is connected to the reference voltage terminal (281), and a plurality of reference voltage output terminals (274b and 274c) of which are connected respectively to a plurality of reference voltage input terminals (273b and 273c) of the gain control circuit (273); a control terminal (280) connected to a control input terminal (273a) of the gain control circuit (273); a first ground terminal (284) connected to a ground terminal (273d) of the gain control circuit (273); second ground terminals (285 and 286) connected to ground terminals (273e and 273f) of the gain control circuit (273); a first supply terminal (282) connected to a supply terminal of the first amplifier (275); a third ground terminal (287) connected to a ground terminal of the first amplifier (275); a second supply terminal (283) connected to a supply terminal of the second amplifier (277); and a fourth ground terminal (288) connected to a ground terminal of the second amplifier (277).

In this circuit, on the basis of the relation between the voltage of the reference voltage input terminal (281) and the voltage of the control terminal (280), the resistance value between the signal input terminal and the signal output terminal of the gain control circuit (273) is adjusted, so that the signal level on the signal output terminal (279) is continuously adjusted relative to the signal level inputted to the signal input terminal (271).

According to the fourth high frequency amplifier circuit of the invention, on the basis of the relation between the voltage of the reference voltage input terminal (281) and the voltage of the control terminal (280), the resistance value between the signal input terminal and the signal output terminal of the gain control circuit (273) is adjusted, so that the signal level on the signal output terminal (279) is continuously adjusted relative to the signal level inputted to the signal input terminal (271). This configuration permits a single control voltage to adjust the gain of the high frequency amplifier circuit, and hence simplifies the control circuit in the high frequency circuit block.

The gain control circuit (273) comprises a variable resistor circuit constructed from an FET.

According to this configuration, the relation between the voltage on the source terminal or the drain terminal of the FET and the voltage on the gate terminal is controlled, so that the resistance between the source terminal and the drain terminal of the FET serves as a variable resistor.

The reference voltage terminal (281) is connected either to the first supply terminal (282) or to the second supply terminal (283).

According to this configuration, the reference voltage terminal of the reference voltage circuit and the supply terminal of the first amplifier or the supply terminal of the second amplifier are shared, so that the number of terminals is reduced in the high frequency amplifier circuit.

In the configuration of the gain control circuit, a first variable resistor circuit constructed from an ET may be provided between the signal input terminal and the signal output terminal. A second variable resistor circuit constructed from an FET may be provided between the signal input terminal and the ground terminal. A third variable resistor circuit constructed from an FET may be provided between the signal output terminal and the ground terminal. Further, a first reference voltage to be applied to the first variable resistor circuit and a second reference voltage to be applied to the second and third variable resistor circuits may be provided.

This configuration allows the first through third variable resistor circuits to operate in a state that the operation range of the first variable resistor circuit, and the operation ranges of second and third variable resistor circuits are shifted relative to the control voltage. This expands the range of the control voltage. As for the second and third variable resistor circuits, it is not necessary to provide the both. When any one of these is provided, the above-mentioned effect is obtained.

Further, the voltage on the control terminal may be divided by the first voltage divider circuit, so that the output of the first voltage divider circuit may be provided to the gate terminal of the FET of the first variable resistor circuit. At the same time, the voltage on the control terminal may be divided by the second voltage divider circuit, so that the output of the second voltage divider circuit may be provided to the source terminal or the drain terminal of the FET of the second variable resistor circuit and to the source terminal or the drain terminal of the RET of the third variable resistor circuit.

In this circuit, the change in the control voltage is reduced by the first voltage divider circuit and the second voltage divider circuit. This expands the setting range of the control voltage of the gain control circuit. Thus, avoided is the necessity of the use of a higher resolution D/A converter in the control circuit for controlling the gain control circuit in the high frequency circuit block.

Further, a resistor may be connected between the source terminal and the drain terminal of the FET of the first variable resistor circuit. A resistor may be connected either between the source terminal or the drain terminal of the FET of the second variable resistor circuit and the signal input terminal or between the drain terminal or the source terminal of the FET of the second variable resistor circuit and the ground terminal. A resistor may be connected either between the source terminal or the drain terminal of the FET of the third variable resistor circuit and the signal output terminal or between the drain terminal or the source terminal of the FET of the third variable resistor circuit and the ground terminal. This configuration notably reduces frequency dependent variation in the gain control characteristics between the voltage of the control terminal and the amount of attenuation in the gain control circuit.

A first mobile communication terminal according to the invention a high frequency circuit block of which comprises: a transmitting section (200) for transmitting a high frequency signal; a receiving section (400) for receiving a high frequency signal; a synthesizer section (410); and a shared device section (500).

The transmitting section (200) comprises: an up converter (201) for converting a modulation signal having an intermediate frequency into a transmission frequency signal; a variable gain high frequency amplifier circuit (202) for amplifying the output signal of the up converter (201); a high frequency switch (203) a common terminal of which is connected to the output terminal of the variable gain high frequency amplifier circuit (202), and which switches the high frequency signal path depending on the transmission frequency; a first band pass filter (204) an input terminal of which is connected to one switching terminal of the high frequency switch (203), and which extracts a signal in a first transmission band; a first high power high frequency amplifier circuit (205) having a fixed gain and amplifying a high frequency signal outputted from the first band pass filter (204); a first isolator (206) for providing the output of the first high power high frequency amplifier circuit (205) to the shared device section (500); a second band pass filter (207) an input terminal of which is connected to the other switching terminal of the high frequency switch (203), and which extracts a signal in a second transmission band; a second high power high frequency amplifier circuit (208) having a fixed gain and amplifying a high frequency signal outputted from the second bandpass filter (207); and a second isolator (209) for providing the output of the second high power high frequency amplifier circuit (208) to the shared device section (500).

The gain control circuit of the variable gain high frequency amplifier circuit (202) comprises: a signal input terminal (231) and a signal output terminal (232); a first variable resistor circuit (260) connecting the signal input terminal (231) to the signal output terminal (232); a second variable resistor circuit (261) connected in parallel to the signal input terminal (231) and a first ground terminal (236); a third variable resistor circuit (262) connected in parallel to the signal output terminal (232) and a second ground terminal (237); a control terminal (233) connected respectively to the first, second, and third variable resistor circuits (260, 261, and 262); a first reference voltage terminal (234) connected to the first variable resistor circuit (260); and a second reference voltage terminal (235) connected to the second and third variable resistor circuits (261 and 262).

In this circuit, the DC resistance between the signal input terminal (231) and the signal output terminal (232) is infinity. The DC resistance between the signal input terminal (231) and the first ground terminal (236) is infinity. The DC resistance between the signal output terminal (232) and the second ground terminal (237) is infinity.

Then, on the basis of the relation between the voltage of the control terminal (233), the voltage of the first reference voltage terminal (234), and the voltage of the second reference voltage terminal (235), the resistance values of the first, second, and third variable resistor circuits (260, 261, and 262) are adjusted continuously, so that the signal level on the signal output terminal (232) is continuously adjusted relative to the signal Level inputted to the signal input terminal (231).

As for the second and third variable resistor circuits (261 and 262), any one of these may be provided, while the other may be omitted.

According to the first mobile communication terminal of the invention, on the basis of the relation between the voltage of the control terminal (233), the voltage of the first reference voltage terminal (234), and the voltage of the second reference voltage terminal (235), the resistance values of the first, second, and third variable resistor circuits (260, 261, and 262) are adjusted continuously, so that the signal level on the signal output terminals (232) is continuously adjusted relative to the signal level inputted to the signal input terminal (231), whereby a control voltage is adjusted, so that the gain of the high frequency amplifier circuit is adjusted continuously. This simplifies the control circuit of the mobile communication terminal.

Further, according to this configuration, the circuit configuration of the first, second, and third variable resistor circuits (260, 261, and 262) of the gain control circuit can be selected depending on the required characteristics. This permits flexible design of the gain control circuit of the high frequency amplifier circuit, and hence increases the degree of freedom in the design of the high frequency circuit block of the mobile communication terminal.

The above-mentioned first variable resistor circuit (260) comprises a first FET (240). The control terminal (233) is connected through at least one or more first resistors (255) to the gate terminal of the first FET (240). The first reference voltage terminal (234) is connected through at least one or more second resistors (239) to the source terminal or the drain terminal of the first FET (240). A third resistor (241) is connected between the source terminal and the drain terminal of the first FET (240).

According to this configuration, on the basis of the relation between the voltage of the control terminal (233) and the voltage of the first reference voltage terminal (234), the resistance between the source terminal and the drain terminal of the first FET (240) serves as a variable resistor which operates in response to the voltage of the control terminal (233). Thus, the gain control circuit of the high frequency amplifier circuit is controlled by a control voltage. This permits the use of a D/A converter in the control circuit of the high frequency amplifier circuit of the mobile communication terminal, and hence simplifies the configuration of the control circuit.

Further, this configuration reduces frequency dependent variation in the passage characteristics between the source terminal and the drain terminal of the first FET (240), and hence reduces variation in the gain control circuit of the high frequency amplifier circuit.

The above-mentioned second variable resistor circuit (261) comprises a second FET (245). The control terminal (233) is connected through at least one or more fourth resistors (259) to the source terminal or the drain terminal of the second FET (245). The second reference voltage terminal (235) is connected through at least one or more fifth resistors (257) to the gate terminal of the second FET (245). A sixth resistor (246) is connected between the source terminal and the drain terminal of the second FET (245). Seventh resistors (244 and 247) are connected at least at one of a position between the signal input terminal (231) and the source terminal or the drain terminal of the second FET (245) and a position between the first ground terminal (236) and the drain terminal or the source terminal of the second FET (245).

According to this configuration, on the basis of the relation between the voltage of the control terminal (233) and the voltage of the second reference voltage terminal (235), the resistance between the source terminal and the drain terminal of the second FET (245) serves as a variable resistor. Thus, the gain control circuit of the high frequency amplifier circuit is controlled by a control voltage. This permits the use of a D/A converter in the control circuit of the high frequency amplifier circuit of the mobile communication terminal, and hence simplifies the configuration of the control circuit.

Further, this configuration reduces frequency dependent variation in the passage characteristics between the source terminal and the drain terminal of the second RET (245), and hence reduces variation in the gain control circuit of the high frequency amplifier circuit.

The above-mentioned third variable resistor circuit (262) comprises a third FET (251). The control terminal (233) is connected through at least one or more eighth resistors (256) to the source terminal or the drain terminal of the third RET (251). The second reference voltage terminal (235) is connected through at least one or more ninth resistors (258) to the gate terminal of the third FET (251). A tenth resistor (252) is connected between the source terminal and the drain terminal of the third FET (251). Eleventh resistors (250 and 253) are connected at least at one of a position between the signal output terminal (232) and the source terminal or the drain terminal of the third FET (251) and a position between the second ground terminal (237) and the drain terminal or the source terminal of the third FET (251).

According to this configuration, on the basis of the relation between the voltage of the control terminal (233) and the voltage of the second reference voltage terminal (235), the resistance between the source terminal and the drain terminal of the third FET (251) serves as a variable resistor. Thus, the gain control circuit of the high frequency amplifier circuit is controlled by a control voltage. This permits the use of a D/A converter in the control circuit of the high frequency amplifier circuit of the mobile communication terminal, and hence simplifies the configuration of the control circuit.

Further, this configuration reduces frequency dependent variation in the passage characteristics between the source terminal and the drain terminal of the third FET (251), and hence reduces variation in the gain control circuit of the high frequency amplifier circuit.

The above-mentioned first FET (240) comprises a source electrode and a drain electrode, and further comprises at least one or more gate electrodes between the source electrode and the drain electrode. The second and third FETs (245 and 251) are similar to this.

According to this configuration, without the necessity of increasing the gate width of the first, second, and third FETs (240, 245, and 251), distortion characteristics is improved for the signal level inputted to the first, second, and third FETs. This permits the construction of a high frequency circuit block of the mobile communication terminal, without a size increase in the gain control circuit of the high frequency amplifier circuit.

A second mobile communication terminal according to the invention a high frequency circuit block of which comprises: a transmitting section (200) for transmitting a high frequency signal; a receiving section (400) for receiving a high frequency signal; a synthesizer section (410); and a shared device section (500).

The transmitting section (200) comprises: an up converter (201) for converting a modulation signal having an intermediate frequency into a transmission frequency signal; a variable gain high frequency amplifier circuit (202) having a gain control circuit and amplifying the output signal of the up converter (201); a high frequency switch (203) a common terminal of which is connected to the output terminal of the variable gain high frequency amplifier circuit (202), and which switches the high frequency signal path depending on the transmission frequency; a first band pass filter (204) an input terminal of which is connected to one switching terminal of the high frequency switch (203), and which extracts a signal in a first transmission band; a first high power high frequency amplifier circuit (205) having a fixed gain and amplifying a high frequency signal outputted from the first band pass filter (204); a first isolator (206) for providing the output of the first high power high frequency amplifier circuit (205) to the shared device section (500); a second band pass filter (207) an input terminal of which is connected to the other switching terminal of the high frequency switch (203), and which extracts a signal in a second transmission band; a second high power high frequency amplifier circuit (208) having a fixed gain and amplifying a high frequency signal outputted from the second band pass filter (207); and a second isolator (209) for providing the output of the second high power high frequency amplifier circuit (208) to the shared device section (500).

The gain control circuit of the variable gain high frequency amplifier circuit (202) comprises: a signal input terminal (291) and a signal output terminal (292); a first variable resistor circuit (325) connecting the signal input terminal (291) to the signal output terminal (292); a second variable resistor circuit (326) connected in parallel to the signal input terminal (291) and a first ground terminal (296); a third variable resistor circuit (327) connected in parallel to the signal output terminal (292) and a second ground terminal (297); a first voltage divider circuit (328) which is connected between a control terminal (293) and a third ground terminal (298) and an output terminal of which is connected to the first variable resistor circuit (325); a second voltage divider circuit (329) which is connected between the control terminal (293) and the third ground terminal (298) and an output terminal of which is connected respectively to the second and third variable resistor circuits (326 and 327); a first reference voltage terminal (294) connected to the first variable resistor circuit (325); and a second reference voltage terminal (295) connected to the second and third variable resistor circuits (326 and 327).

In this circuit, the DC resistance between the signal input terminal (291) and the signal output terminal (292) is infinity. The DC resistance between the signal input terminal (291) and the first ground terminal (296) is infinity. The DC resistance between the signal output terminal (292) and the second ground terminal (297) is infinity.

Then, on the basis of the relation between the voltage of the control terminal (293), the voltage of the first reference voltage terminal (294), and the voltage of the second reference voltage terminal (295), the resistance values of the first, second, and third variable resistor circuits (325, 326, and 327) are adjusted continuously, so that the signal level on the signal output terminal (292) is continuously adjusted relative to the signal level inputted to the signal input terminal (291).

As for the second and third variable resistor circuits (326 and 327), any one of these may be provided, while the other may be omitted.

According to the second mobile communication terminal of the invention, on the basis of the relation between the voltage of the control terminal (293), the voltage of the first reference voltage terminal (294), and the voltage of the second reference voltage terminal (295), the resistance values of the first, second, and third variable resistor circuits (325, 326, and 327) are adjusted continuously, so that the signal level on the signal output terminal (292) is continuously adjusted relative to the signal level inputted to the signal input terminal (291), whereby a control voltage is adjusted, so that the gain of the high frequency amplifier circuit is adjusted continuously. This simplifies the control circuit of the mobile communication terminal.

Further, according to this configuration, the circuit configuration of the first, second, and third variable resistor circuits (325, 326, and 327) of the gain control circuit can be selected depending on the required characteristics. This permits flexible design of the gain control circuit of the high frequency amplifier circuit, and hence increases the degree of freedom in the design of the high frequency circuit block of the mobile communication terminal.

Furthermore, according to this configuration, the voltage on the control terminal (293) is divided by the first voltage divider circuit (328) and the second voltage divider circuit (329), and then provided to the first, second, and third variable resistor circuits (325, 326, and 327). This allows the gain of the high frequency amplifier circuit to be adjusted continuously across a wider range of the control voltage.

The above-mentioned first variable resistor circuit (325) comprises a first FET (301), while the first voltage divider circuit (328) comprises at least two first resistors (316 and 317). The control terminal (293) is connected to the first voltage divider circuit 328), while the output terminal of the first voltage divider circuit (328) is connected through at least one or more second resistors (318) to the gate terminal of the first FET (301). The first reference voltage terminal (294) is connected through at least one or more third resistors (300) to the source terminal or the drain terminal of the first FET (301). A fourth resistor (302) is connected between the source terminal and the drain terminal of the first RET (301).

According to this configuration, on the basis of the relation between the voltage of the control terminal (293) and the voltage of the first reference voltage terminal (294), the resistance between the source terminal and the drain terminal of the first FET (301) serves as a variable resistor. This allows the control voltage to control the gain control circuit of the high frequency amplifier circuit across a wider range of the control voltage. This permits the use of an ordinary resolution D/A converter in the control circuit of the high frequency circuit block of the mobile communication terminal, and hence simplifies the configuration of the control circuit.

The above-mentioned second variable resistor circuit (326) comprises a second FET (306), while the second voltage divider circuit (329) comprises at least two fifth resistors (319 and 320). The control terminal (293) is connected to the second voltage divider circuit (329), while the output terminal of the second voltage divider circuit (329) is connected through at least one or more sixth resistors (321) to the source terminal or the drain terminal of the second FET (306). The second reference voltage terminal (295) is connected through at least one or more seventh resistors (323) to the gate terminal of the second FET (306). An eighth resistor (307) is connected between the source terminal and the drain terminal of the second FET (306). Ninth resistors (305 and 308) are connected at least at one of a position between the signal input terminal (291) and the source terminal or the drain terminal of the second FET (306) and a position between the first ground terminal (296) and the drain terminal or the source terminal of the second FET (306).

According to this configuration, on the basis of the relation between the voltage generated by dividing the control terminal (293) voltage using the second voltage divider circuit (329) and the voltage of the second reference voltage terminal (295), the resistance between the source terminal and the drain terminal of the second FET (306) serves as a variable resistor. This allows the control voltage to control the gain control circuit of the high frequency amplifier circuit across a wider range of the control voltage. This permits the use of an ordinary resolution D/A converter in the control circuit of the high frequency circuit block of the mobile communication terminal, and hence simplifies the configuration of the control circuit.

Further, this configuration reduces frequency dependent variation in the passage characteristics between the source terminal and the drain terminal of the second FET (306), and hence reduces variation in the gain control circuit of the high frequency amplifier circuit.

The above-mentioned third variable resistor circuit (327) comprises a third FET (312), while the second voltage divider circuit (329) comprises at least two fifth resistors (319 and 320) The control terminal (293) is connected to the second voltage divider circuit (329), while the output terminal of the second voltage divider circuit (329) is connected through at least one or more tenth resistors (322) to the source terminal or the drain terminal of the third FET (312). The second reference voltage terminal (295) is connected through at least one or more eleventh resistors (324) to the gate terminal of the third FET (312). A twelfth resistor (313) is connected between the source terminal and the drain terminal of the third FET (312). Thirteenth resistors (311 and 314) are connected at least at one of a position between the signal output terminal (292) and the source terminal or the drain terminal of the third FET (312) and a position between the second ground terminal (297) and the drain terminal or the source terminal of the third FET (312).

According to this configuration, on the basis of the relation between the voltage generated by dividing the control terminal (293) voltage using the second voltage divider circuit (329) and the voltage of the second reference voltage terminal (295), the resistance between the source terminal and the drain terminal of the third FET (312) serves as a variable resistor. This allows the control voltage to control the gain control circuit of the high frequency amplifier circuit across a wider range of the control voltage. This permits the use of an ordinary resolution D/A converter in the control circuit of the high frequency circuit block of the mobile communication terminal, and hence simplifies the configuration of the control circuit.

Further, this configuration reduces frequency dependent variation in the passage characteristics between the source terminal and the drain terminal of the third FET (312), and hence reduces variation in the variable resistor circuit of the high frequency amplifier circuit.

The first FET (301) comprises a source electrode and a drain electrode, and further comprises at least one or more gate electrodes between the source electrode and the drain electrode. The second and third FETs (306 and 312) are similar to this.

According to this configuration, without the necessity of increasing the gate width of the first, second, and third FETs (301, 306, and 312), distortion characteristics is improved for the signal level inputted to the FETs. This permits the construction of a high frequency circuit block of the mobile communication terminal, without a size increase in the high frequency amplifier circuit.

DESCRIPTION OF THE PREFERRED EMBODIMENTS

A high frequency amplifier circuit according to embodiments of the invention and a mobile communication terminal using the same are described below with reference to the drawings.

Embodiment 1

Figure 1:
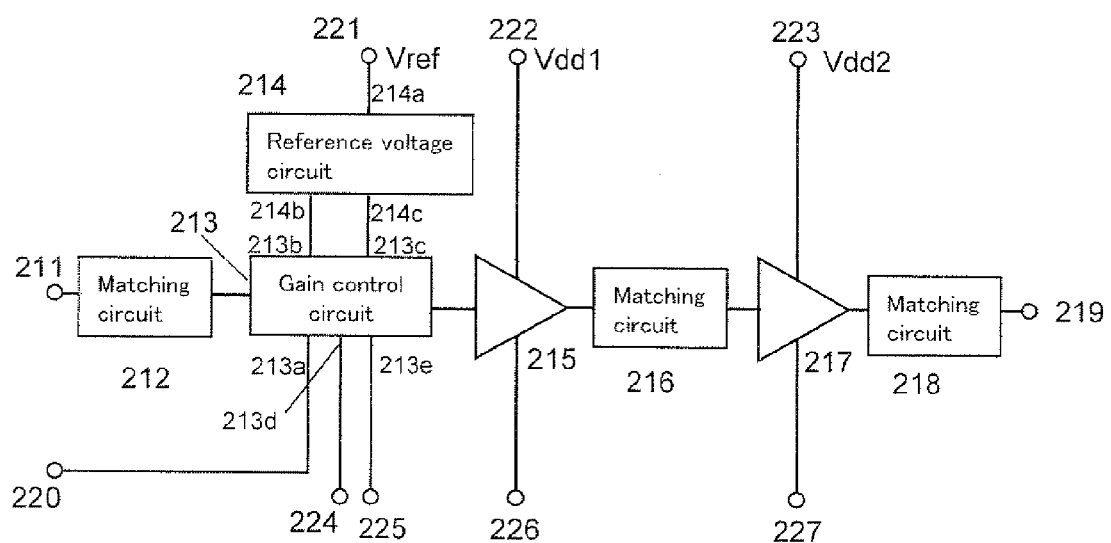
FIG. 1 is a block diagram showing the configuration of a high frequency amplifier circuit according to Embodiment 1 of the invention.

FIG. 1 is a block diagram showing the configuration of a high frequency amplifier circuit according to Embodiment 1 of the invention. The high frequency amplifier circuit of FIG.

Figure 8:
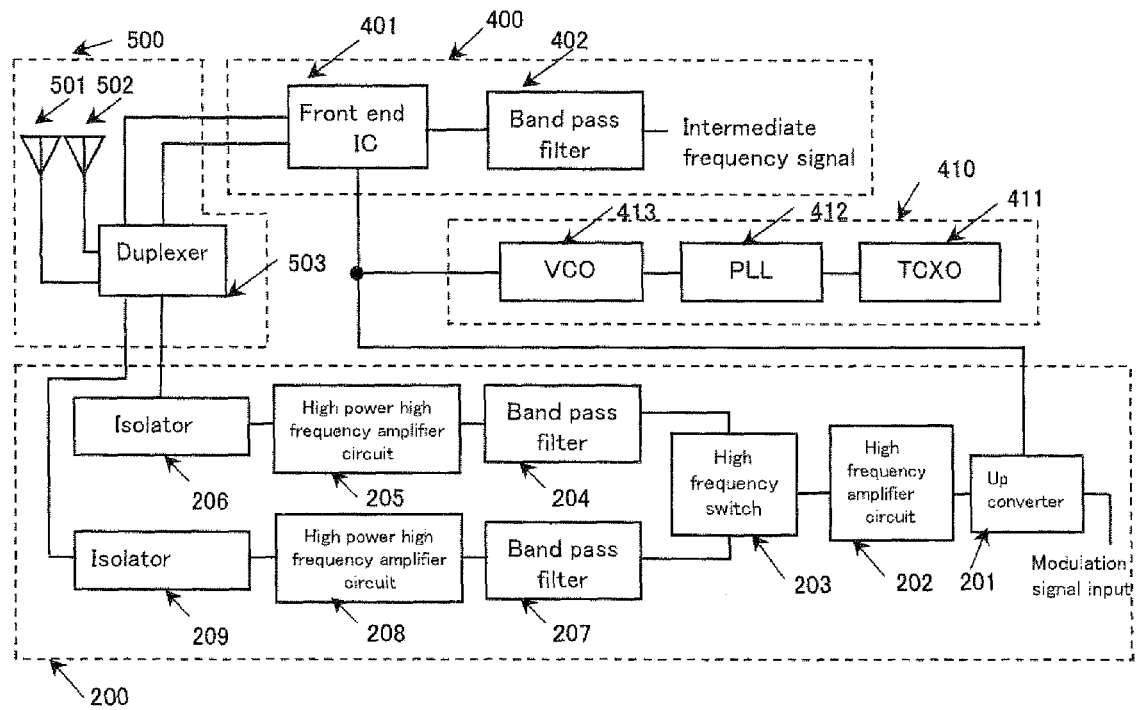
FIG. 8 is a block diagram showing the configuration of a radio section of a prior art portable telephone terminal.
Figure 9:
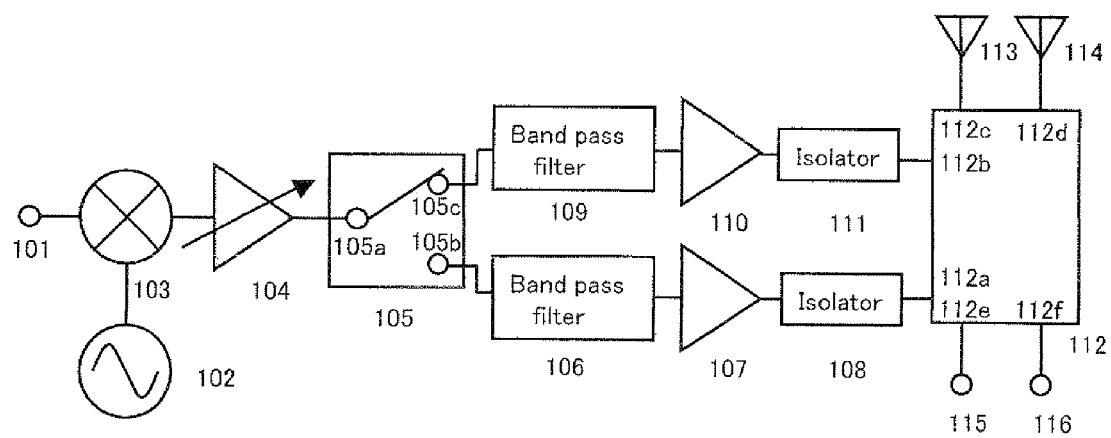
FIG. 9 is a block diagram showing another configuration of a radio section of a prior art portable telephone terminal.
Figure 10:
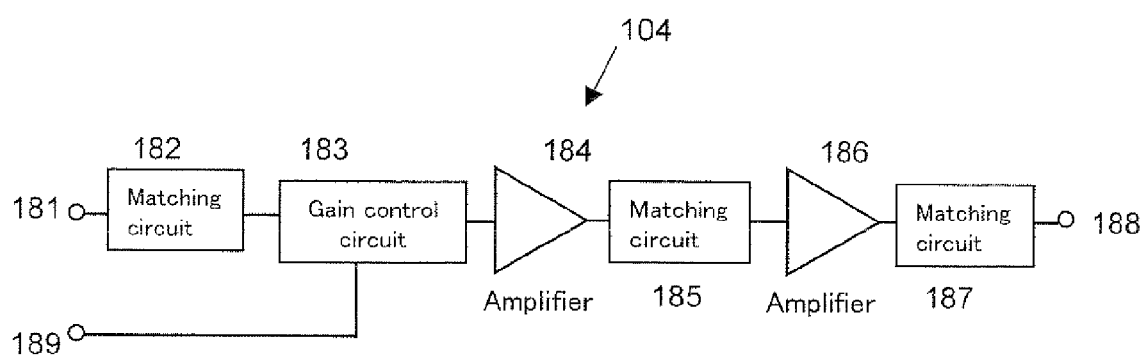
FIG. 10 is a block diagram showing the configuration of a prior art high frequency amplifier circuit.
Figure 11:
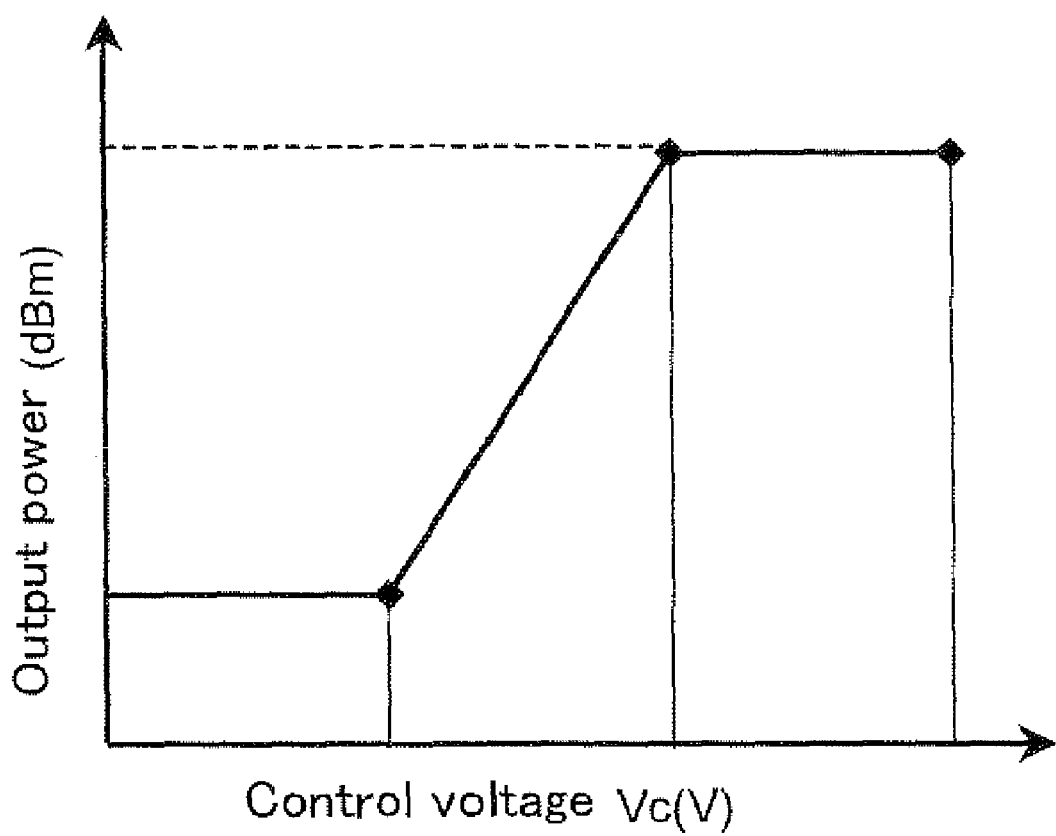
FIG. 11 is a graph showing the state of a gain control circuit in a prior art high frequency amplifier circuit.
Figure 12:
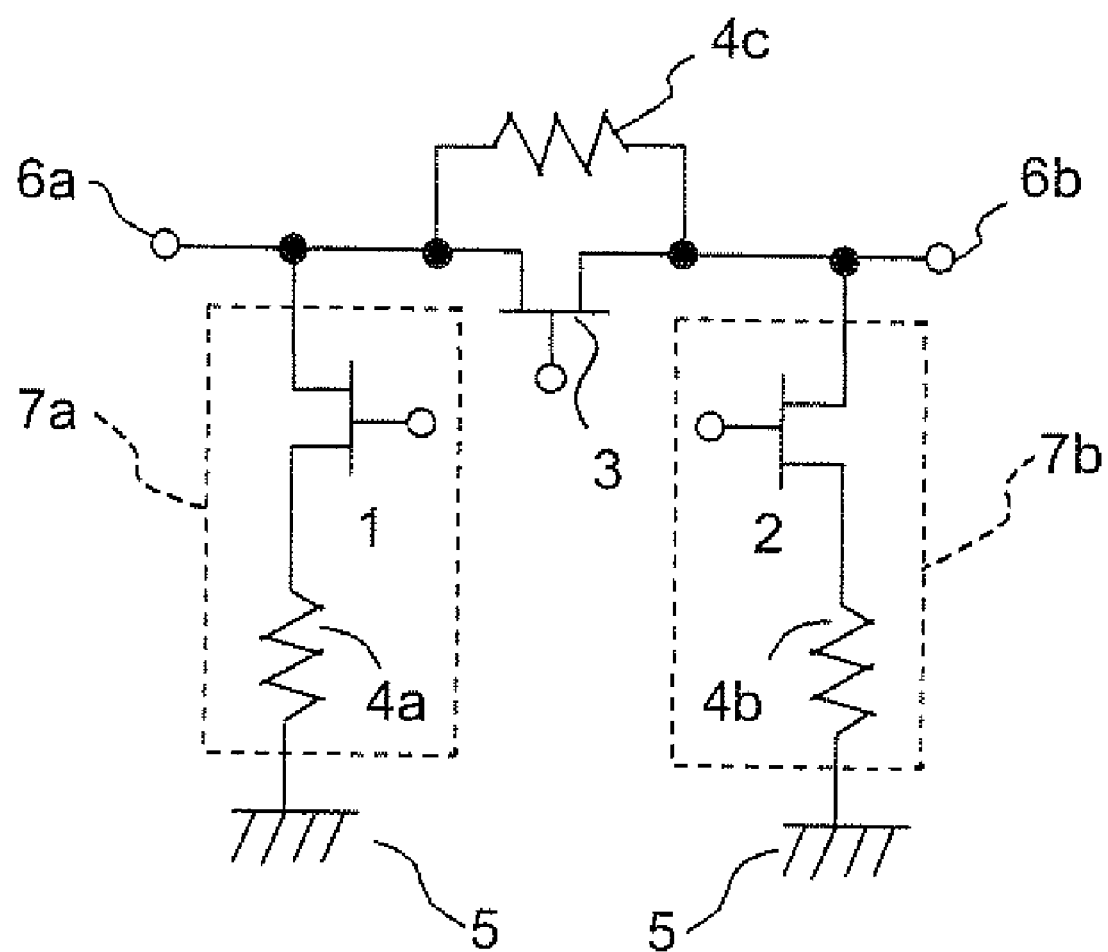
FIG. 12 is a circuit diagram showing the configuration of a prior art gain control circuit.
Figure 13A:
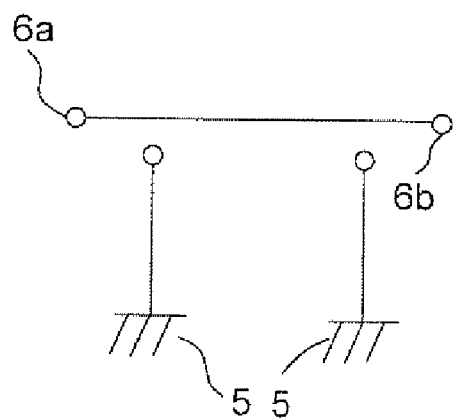
FIGS. 13A and 13B are equivalent circuit diagrams for a prior art gain control circuit.
Figure 13B:
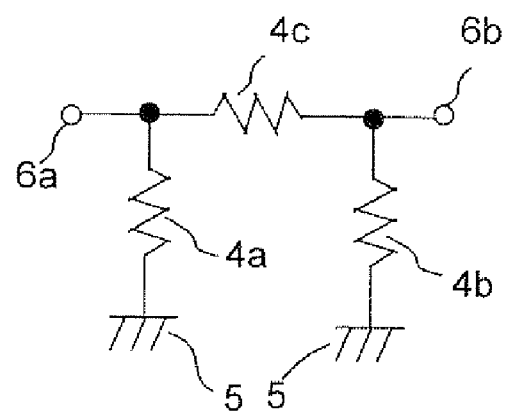

1 corresponds to the high frequency amplifier circuit 202 shown in the block diagram of FIG. 8 illustrating a transmitting section of a prior art portable telephone terminal. That is, in the portable telephone terminal according to the embodiment of the invention, the high frequency amplifier circuit of FIG. 1 is used in place of the high frequency amplifier circuit 202 in the transmitting section of the prior art portable telephone terminal of FIG. 8.

The high frequency amplifier circuit of FIG. 1 is described below in detail.

In FIG. 1, a high frequency signal inputted through a signal input terminal 211 is provided through a matching circuit 212 for impedance transformation to a gain control circuit 213. The output signal of the gain control circuit 213 is inputted to an amplifier 215, and thereby amplified. The output signal of the amplifier 215 is provided through a matching circuit 216 for impedance transformation to an amplifier 217, and thereby amplified. The output signal of the amplifier 217 is provided through a matching circuit 218 for impedance transformation to a signal output terminal 219.

A reference voltage terminal 221 onto which a reference voltage Vref is applied is connected to a supply terminal 214a of a reference voltage circuit 214. A reference voltage terminal 214b of the reference voltage circuit 214 is connected to a reference voltage terminal 213b of the gain control circuit 213. A reference voltage terminal 214c of the reference voltage circuit 214 is connected to a reference voltage terminal 213c of the gain control circuit 213.

A gain control terminal 220 is connected to a gain control terminal 213a of the gain control circuit 213. A GND terminal 224 is connected to a ground terminal 213d of the gain control circuit 213. A GND terminal 225 is connected to a ground terminal 213e of the gain control circuit 213.

A supply terminal 222 onto which a supply voltage Vdd1 is applied is connected to a supply terminal of the amplifier 215. A GND terminal 226 is connected to a ground terminal of the amplifier 215

A supply terminal 223 onto which a supply voltage Vdd2 is applied is connected to a supply terminal of the amplifier 217. A GND terminal 227 is connected to a ground terminal of the amplifier 217.

The operation of the high frequency amplifier circuit of FIG. 1 is described below. The voltage values of the supply terminal 222, the supply terminal 223, the reference voltage terminal 221, and the gain control terminal 220 are set respectively at predetermined values, so that the amount of attenuation of the gain control circuit 213 is adjusted, so that gain control is performed in the high frequency amplifier circuit.

Figure 2:
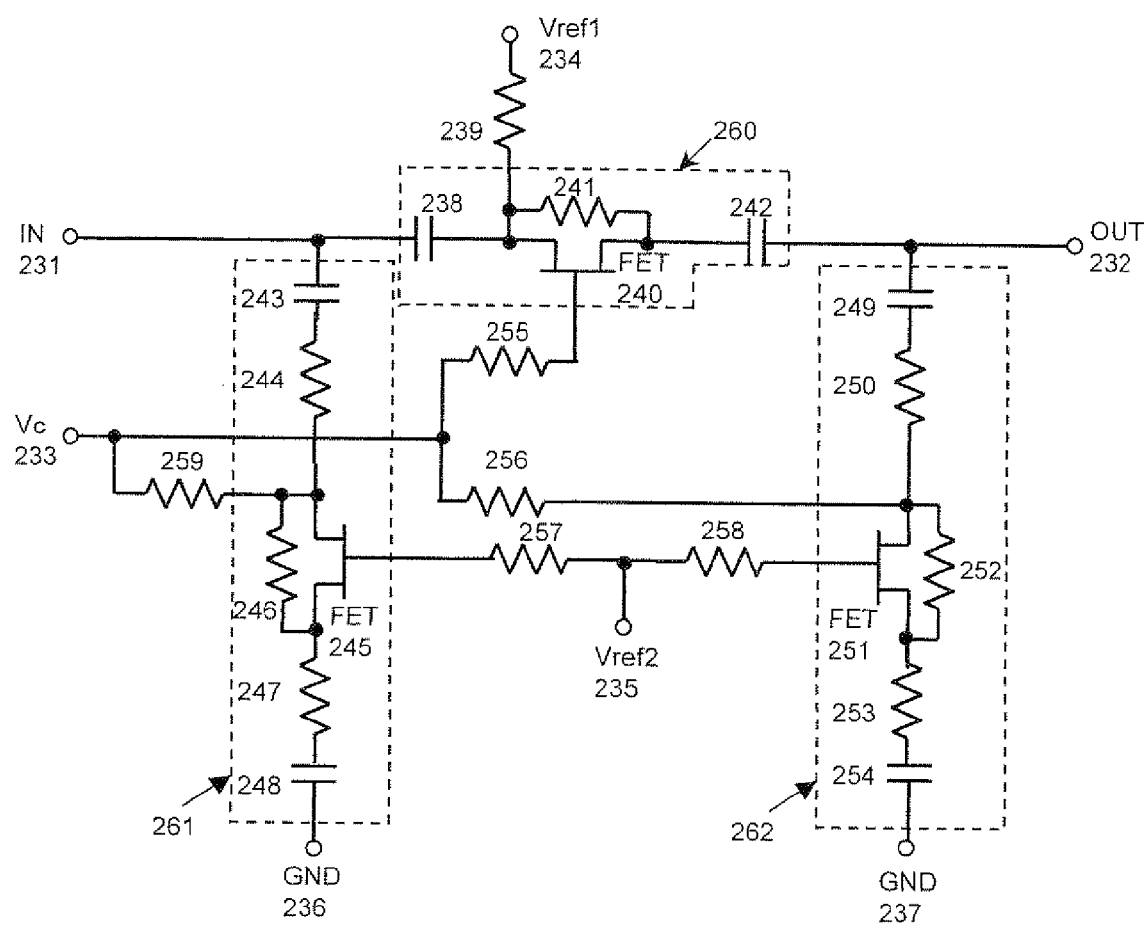
FIG. 2 is a circuit diagram showing the circuit configuration of a gain control circuit in a high frequency amplifier circuit according to Embodiment 1 of the invention.

FIG. 2 is a detailed circuit diagram showing the gain control circuit of FIG. 1. In FIG. 2, a signal input terminal (IN) 231 corresponding to the input terminal of the gain control circuit 213 is connected to one end of a capacitor 238 and to one end of a capacitor 243. The other end of the capacitor 238 is connected to the source terminal of an FET 240, to one end of a resistor 239, and to one end of a resistor 241.

The other end of the resistor 239 is connected to a reference voltage terminal (Vref1) 234 corresponding to the terminal 213b of the gain control circuit 213. The other end of the resistor 241 is connected to the drain terminal of the FET 240 and to one end of a capacitor 242. A signal output terminal (OUT) 232 corresponding to the output terminal of the gain control circuit 213 is connected to the other end of the capacitor 242 and to one end of a capacitor 249.

The other end of the capacitor 243 is connected to one end of a resistor 244. A control terminal (Vc) 233 corresponding to the terminal 213a of the gain control circuit 213 is connected to one end of a resistor 255, to one end of a resistor 256, and to one end of a resistor 259. The other end of the resistor 244 is connected to the source terminal of an FET 245, to the other end of the resistor 259, and to one end of a resistor 246. The other end of the resistor 255 is connected to the gate terminal of the FET 240.

One end of a resistor 247 is connected to the drain terminal of the FET 245 and to the other end of the resistor 246. The other end of the resistor 247 is connected to one end of a capacitor 248. A GND terminal 236 corresponding to the terminal 213d of the gain control circuit 213 is connected to the other end of the capacitor 248.

The other end of the capacitor 249 is connected to one end of a resistor 250. The other end of the resistor 250 is connected to the source terminal of an FET 251, to the other end of the resistor 256, and to one end of a resistor 252. The drain terminal of the FET 251 is connected to the other end of the resistor 252 and to one end of a resistor 253. The other end of the resistor 253 is connected to one end of a capacitor 254. A GND terminal 237 corresponding to the terminal 213e of the gain control circuit 213 is connected to the other end of the capacitor 254.

A reference voltage terminal (Vref2) 235 corresponding to the terminal 213c of the gain control circuit 213 is connected to one end of a resistor 257 and to one end of a resistor 258. The other end of the resistor 257 is connected to the gate terminal of the FET 245. The other end of the resistor 258 is connected to the gate terminal of the FET 251.

The circuit composed of the capacitor 238, the FET 240, the resistor 241, and the capacitor 242 connected between the signal input terminal 231 and the signal output terminal 232 is referred to as a variable resistor circuit 260. The circuit composed of the capacitor 243, the resistor 244, the FET 245, the resistor 246, the resistor 247, and the capacitor 248 connected between the signal input terminal 231 and the GND terminal 236 is referred to as a variable resistor circuit 261. The circuit composed of the capacitor 249, the resistor 250, the FET 251, the resistor 252, the resistor 253, and the capacitor 254 connected between the signal output terminal 232 and the GND terminal 237 is referred to as a variable resistor circuit 262.

In the FETs 240, 245, and 251, the positions of the source terminal and the drain terminal may be interchanged.

Further, the order of connection of the capacitor 243 and the resistor 244 and the order of connection of the resistor 247 and the capacitor 248 may be reversed. Furthermore, the order of connection of the capacitor 249 and the resistor 250 and the order of connection of the resistor 253 and the capacitor 254 may be reversed.

In this example, the other end of the resistor 239 is connected to the source terminal of the FET 240 and to one end of the resistor 241. However, the other end of the resistor 239 may be connected to the drain terminal of the FET 240 and to the other end of the resistor 241. Further, the other end of the resistor 259 is connected to the source terminal of the FET 245 and to one end of the resistor 246. However, the other end of the resistor 259 may be connected to the drain terminal of the FET 245 and to the other end of the resistor 246. The other end of the resistor 256 is connected to the source terminal of the FET 251 and to one end of the resistor 252. However, the other end of the resistor 256 may be connected to the drain terminal of the FET 251 and to the other end of the resistor 252.

The operation of the high frequency amplifier circuit having such configuration according to the present embodiment is described below.

The operation of the FETs as variable resistors in the gain control circuit of FIG. 2 is described below briefly. The relation between the control voltage Vc, the reference voltage Vref1, and the reference voltage Vref2 is set into a predetermined situation, so that the resistance between the source terminal and the drain terminal of each of the FETs 240, 245, and 251 is adjusted. By virtue of this, the amount of attenuation is adjusted between the signal input terminal 231 and the signal output terminal 232, so that gain control is performed in the high frequency amplifier circuit.

Here, it is assumed that the resistors 239, 241, 246, 252, 255, 256, 257, 258, and 259 have a high resistance, and that almost no voltage drop occurs between the terminals of each resistor.

In the case that the FETs serve as variable resistors in the circuit of FIG. 2, the voltage of the control terminal 233 onto which a control voltage or gain control voltage is applied is denoted by Vc. The voltage of the reference voltage terminal 234 is denoted by Vref1, while the voltage of the reference voltage terminal 235 is denoted by Vref2. At that time, the gate terminal of the FET 240 has almost the same potential as the voltage Vc of the control terminal 233, while the source terminal and the drain terminal of the FET 240 have almost the same potential as the voltage Vref1 of the reference voltage terminal 234. The source terminal and the drain terminal of the FET 245 have almost the same potential as the voltage Vc of the control terminal 233, while the gate terminal of the FET 245 has almost the same potential as the voltage Vref2 of the reference voltage terminal 235. The source terminal and the drain terminal of the FET 251 have almost the same potential as the voltage Vc of the control terminal 233, while the gate terminal of the FET 251 has almost the same potential as the voltage Vref2 of the reference voltage terminal 235.

Figure 3A:
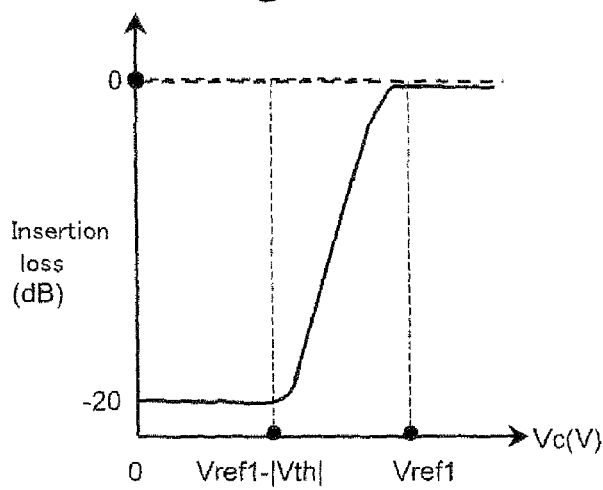
FIGS. 3A, 3B, and 3C are graphs showing the state of a gain control circuit in a high frequency amplifier circuit according to Embodiment 1 of the invention.
Figure 3B:
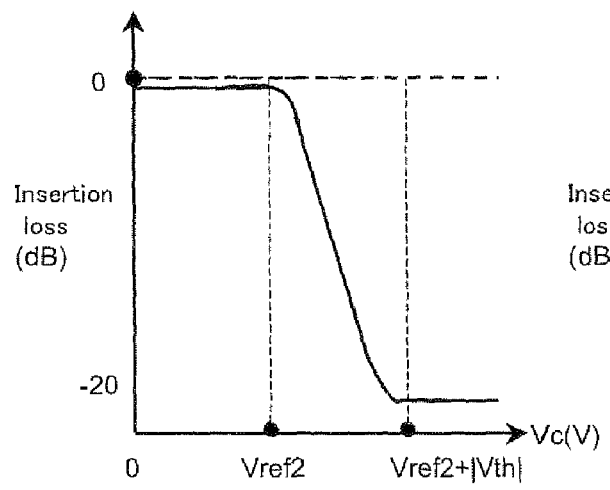
Figure 3C:
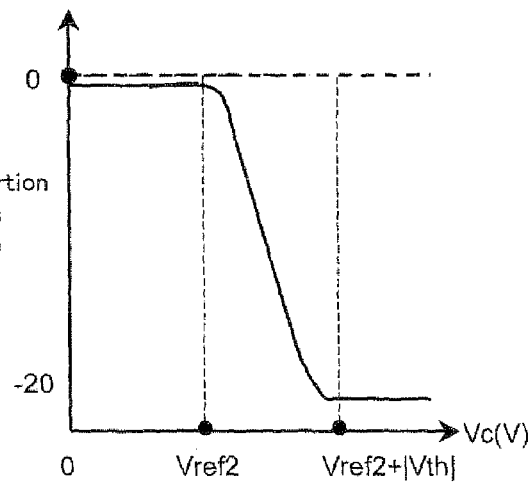

FIGS. 3A, 3B, and 3C show the relation between the control voltage and the amount of attenuation between the source terminal and the drain terminal when a signal is inputted to the source terminal of the FETs 240, 245, and 251. The amount of attenuation is defined as the power ratio of the signal inputted to the source terminal of the FETs 240, 245, and 251 to the signal outputted from the drain terminal. FIG. 3A shows the relation between the voltage Vc of the control terminal 233 and the amount of attenuation between the source terminal and the drain terminal of the FET 240. FIG. 3B shows the relation between the voltage Vc of the control terminal 233 and the amount of attenuation between the source terminal and the drain terminal of the FET 245. FIG. 3C shows the relation between the voltage Vc of the control terminal 233 and the amount of attenuation between the source terminal and the drain terminal of the FET 251.

In FIGS. 3A, 3B, and 3C, the low impedance is defined as an insertion loss of 0 dB or the like. The high impedance is defined as an insertion loss of −20 dB or lower. Then, the relation of impedance between the source terminal and the drain terminal of the FETs 240, 245, and 251 is summarized as follows.

(FET 240)
When Vc>Vref1,
the source-drain is in the low impedance range.
When Vc<Vref1−|Vth|
the source-drain is in the high impedance range.
When Vref1−|Vth|≦Vc≦Vref1,
the source-drain is in the variable resistor range.
(FETs 245 and 251)
When Vc<Vref2,
the source-drain is in the low impedance range.
When Vc>Vref2+|Vth|
the source-drain is in the high impedance range.
When Vref2≦Vc≦Vref2+|Vth|,
the source-drain is in the variable resistor range.

Here, Vth indicates the threshold voltage of the FETs 240, 245, and 251.

Described below is the operation when the gain control circuit in the circuit of FIG. 2 is applied in a high frequency circuit block of a multi band mobile communication terminal. In this example, the following operation conditions are assumed. The frequencies of two kinds of signals to be inputted through the signal input terminal 231 are 940 MHz and 1.95 GHz. The voltage (Vref1) applied to the reference voltage terminal 234 is 1.9 V, while the voltage (Vref2) applied to the reference voltage terminal 235 is 1.2V. The voltage applied to the control terminal 233 ranges from 0V to 3 V. The resistors 244, 247, 250, and 253 have a resistance of 10Ω. The resistor 241 has a resistance of 500Ω. The capacitors 238, 242, 243, 248, 249, and 254 have a capacitance of 100 pF. The FETs 240, 245, and 251 have a threshold voltage Vth of −0.6V. The resistors other than those mentioned here have a high resistance ranging from a few kΩ to a few hundreds kΩ.

Figure 4:
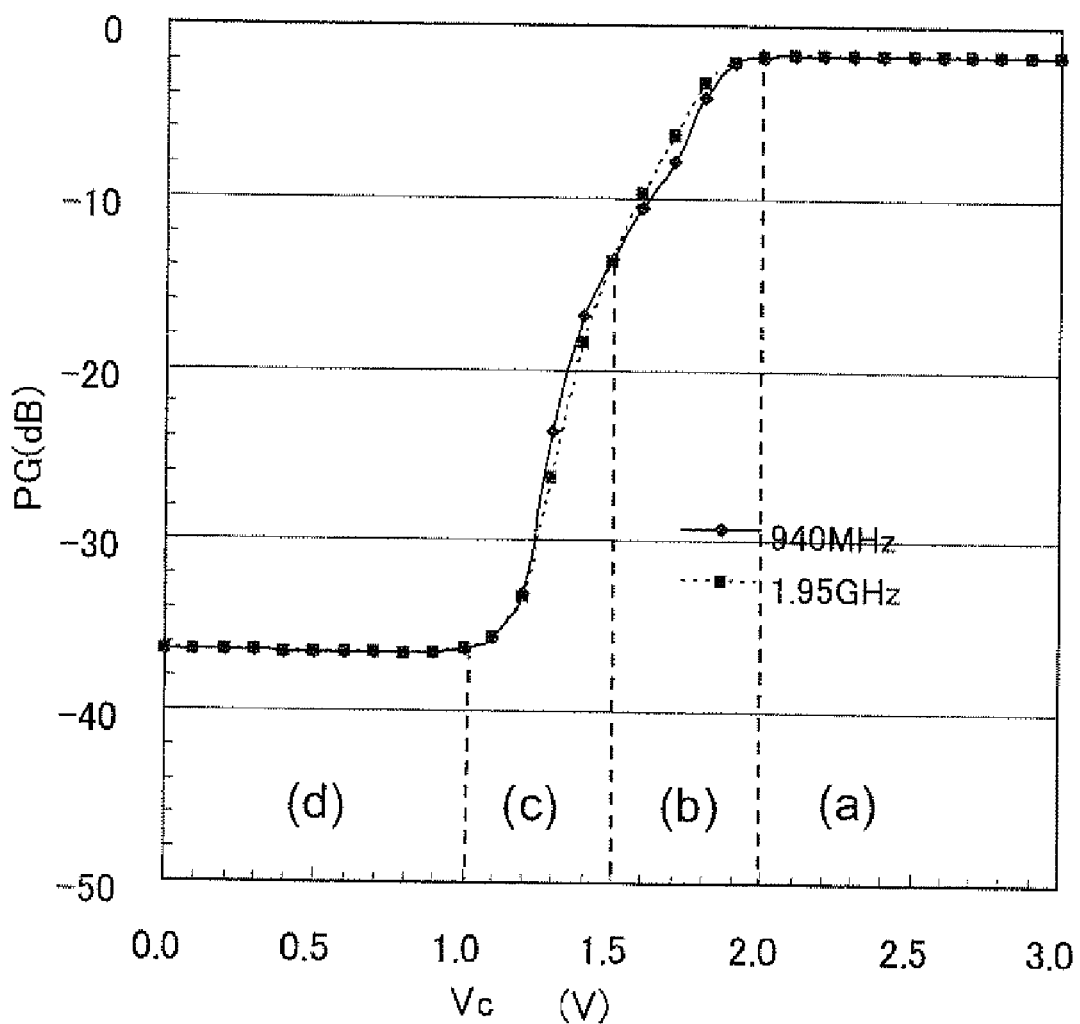
FIG. 4 is a graph showing the state of a gain control circuit in a high frequency amplifier circuit according to Embodiment 1 of the invention.

FIG. 4 shows the relation between the control voltage Vc and the ratio PG of the output power of the signal output terminal 232 to the input power of the signal input terminal 231 in the gain control circuit of FIG. 2.

When the voltage on the control terminal 233 is at 2 V or higher (range a in FIG. 4), the FET 240 is in the low impedance state, while the FETs 245 and 251 are in the high impedance state. Thus, the amount of attenuation for the signal is small in the gain control circuit. Further, the amount of attenuation is constant independently of a change in the control voltage.

When the voltage on the control terminal 233 is at 1.5 V or higher and below 2 V (range b in FIG. 4), the FET 240 is in the low impedance state, while the FETs 245 and 251 are in the state that the amount of attenuation decreases with increasing gain control voltage. Thus, the amount of attenuation in the gain control circuit varies depending on the control voltage.

When the FET 245 in the variable resistor circuit 261 is in the low impedance state, and at the same time the FET 251 in the variable resistor circuit 262 is in the low impedance state, the amount of attenuation becomes maximum in the gain control circuit. Here, it should be noted that the impedance of the variable resistor circuit 261 does not go at or below the impedance of a series circuit of the capacitor 243, the resistor 240, the resistor 247, and the capacitor 248. Similarly, the impedance of the variable resistor circuit 262 does not go at or below the impedance of a series circuit of the capacitor 249, the resistor 250, the resistor 253, and the capacitor 254.

At the frequency of the signal inputted to the gain control circuit, when the capacitance values of the capacitors 243, 248, 249, and 254 are set such that their impedance values are negligible small, so that these capacitors serve as coupling capacitors for blocking the DC components, the amounts of attenuation in the variable resistor circuits 261 and 262 are determined by the resistors 244, 247, 250, and 253. This reduces the frequency dependence in the variable resistor circuits 261 and 262.

When the voltage on the control terminal 233 is at 1 V or higher and below 1.5 V (range c in FIG. 4), the FET 240 is in the state that the amount of attenuation decreases with increasing gain control voltage. The FETs 245 and 251 are in the low impedance state. Thus, the amount of attenuation in the gain control circuit varies depending on the control voltage.

When the FET 240 in the variable resistor circuit 260 is in the high impedance states the amount of attenuation becomes maximum in the gain control circuit. Here, it should be noted that the impedance of the variable resistor circuit 260 does not reach or exceed the impedance of a series circuit of the capacitor 238, the resistor 241, and the capacitor 242.

At the frequency of the signal inputted to the gain control circuit, when the capacitance values of the capacitors 238 and 242 are set such that their impedance values are negligible small, so that these capacitors serve as coupling capacitors for blocking the DC components, the amount of attenuation in the variable resistor circuit 260 is determined by the resistor 241. This reduces the frequency dependence in the variable resistor circuit 260.

When the voltage on the control terminal 233 is at 0 V or higher and below 1 V (range d in FIG. 4), the FET 240 is in the high impedance state, while the FETs 245 and 251 are in the low impedance state. Thus, the amount of attenuation in the gain control circuit is large and constant independently of a change in the control voltage.

The present example has been described for the case that the resistors 244 and 247 in the variable resistor circuit 261 and the resistors 250 and 253 in the variable resistor circuit 262 have a resistance of 10Ω. However, the present invention is not limited to this value. That is, it is sufficient that such resistors are inserted into the variable resistor circuits 261 and 262. Thus, the circuit configuration and the resistance values of the variable resistor circuits 261 and 262 may be adjusted flexibly depending on the circuit layout.

FIG. 4 shows experimental results for the two frequencies of 940 MHz and 1.95 GHz inputted to the gain control circuit. As seen from FIG. 4 illustrating the relation between the gain control voltage and the amount of attenuation, frequency dependent variation in the gain control characteristics is notably reduced.

As such, in the gain control circuit of FIG. 2, two kinds of reference voltages are set in the gain control circuit. Then, the FET 240 inserted in series to a signal line formed between the signal input terminal 231 and the signal output terminal 232 and the FETs 245 and 251 inserted in parallel (in a shunt position) to the signal line formed between the signal input terminal 231 and the signal output terminal 232 are operated in a state that their operation ranges are shifted. This allows a single control terminal to control the amount of attenuation in the gain control circuit across a wider gain control voltage range and a wider frequency range.

Further, in the gain control circuit of FIG. 1, the reference voltage terminal 221 can be shared with the supply terminal 222 or 223. This reduces the number of terminals in the high frequency amplifier circuit, and hence reduces the area size of the high frequency amplifier circuit assembly.

Furthermore, in the gain control circuit of FIG. 2, when a multigate FET which has a plurality of gate electrodes between the source electrode and the drain electrode is used as each FET in the gain control circuit, distortion characteristics for the signal level inputted to the FET is improved without the necessity of increasing the gate width.

Further, in the gain control circuit of FIG. 2, any one of the variable resistor circuits 261 and 262 inserted in parallel (in a shunt position) to the signal line may be omitted. This simplifies the configuration of the variable resistor circuits. Further, as for the relation between the gain control voltage and the amount of attenuation, frequency dependent variation in the gain control characteristics is notably reduced. Furthermore, this configuration allows a single control terminal to control the amount of attenuation in the gain control circuit across a wider gain control voltage range and a wider frequency range.

Embodiment 2

Figure 5:
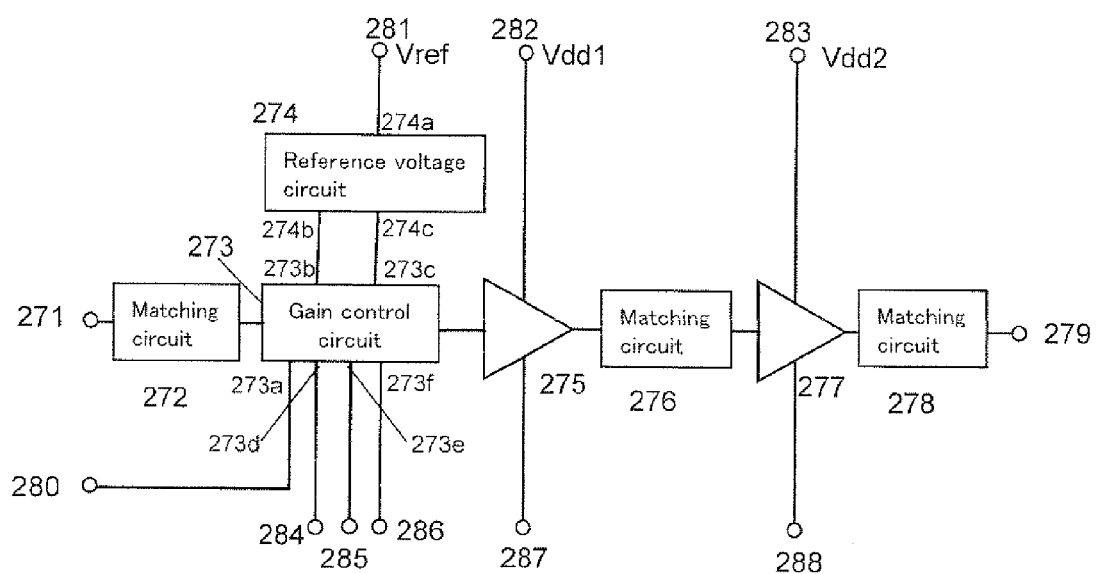
FIG. 5 is a block diagram showing the configuration of a high frequency amplifier circuit according to Embodiment 2 of the invention.

FIG. 5 is a block diagram showing the configuration of a high frequency amplifier circuit according to Embodiment 2 of the invention. The high frequency amplifier circuit of FIG. 5 corresponds to the high frequency amplifier circuit 202 shown in the block diagram of FIG. 8 illustrating a transmitting section of a prior art portable telephone terminal. That is, in the portable telephone terminal according to the embodiment of the invention, the high frequency amplifier circuit of FIG. 5 is used in place of the high frequency amplifier circuit 202 in the transmitting section of the prior art portable telephone terminal of FIG. 8.

The high frequency amplifier circuit of FIG. 5 is described below in detail.

In FIG. 5, a high frequency signal inputted through a signal input terminal 271 is provided through a matching circuit 272 for impedance transformation to a gain control circuit 273 having a voltage divider circuit. The output signal of the gain control circuit 273 is inputted to an amplifier 275, and thereby amplified. The output signal of the amplifier 275 is provided through a matching circuit 276 for impedance transformation to an amplifier 277, and thereby amplified. The output signal of the amplifier 277 is provided through a matching circuit 278 for impedance transformation to a signal output terminal 279.

A reference voltage terminal 281 onto which a reference voltage Vref is applied is connected to a supply terminal 274a of a reference voltage circuit 274. A reference voltage terminal 274b of the reference voltage circuit 274 is connected to a reference voltage terminal 273b of the gain control circuit 273. A reference voltage terminal 274c of the reference voltage circuit 274 is connected to a reference voltage terminal 273c of the gain control circuit 273.

A gain control terminal 280 is connected to a gain control terminal 273a of the gain control circuit 273. A GND terminal 284 is connected to a ground terminal 273d of the voltage divider circuit in the gain control circuit 273. A GND terminal 285 is connected to a ground terminal 273e of the gain control circuit 273. A GND terminal 286 is connected to a ground terminal 273f of the gain control circuit 273.

A supply terminal 282 onto which a supply voltage Vdd1 is applied is connected to a supply terminal of the amplifier 275. A GND terminal 287 is connected to a ground terminal of the amplifier 275.

A supply terminal 283 onto which a supply voltage Vdd2 is applied is connected to a supply terminal of the amplifier 277. A GND terminal 288 is connected to a ground terminal of the amplifier 277.

The gain control operation of the high frequency amplifier circuit of FIG. 5 is described below. The voltage values of the supply terminal 282, the supply terminal 283, the reference voltage terminal 281, and the gain control terminal 280 are set respectively at predetermined values, so that the amount of attenuation of the gain control circuit is adjusted, so that gain control is performed in the high frequency amplifier circuit.

Figure 6:
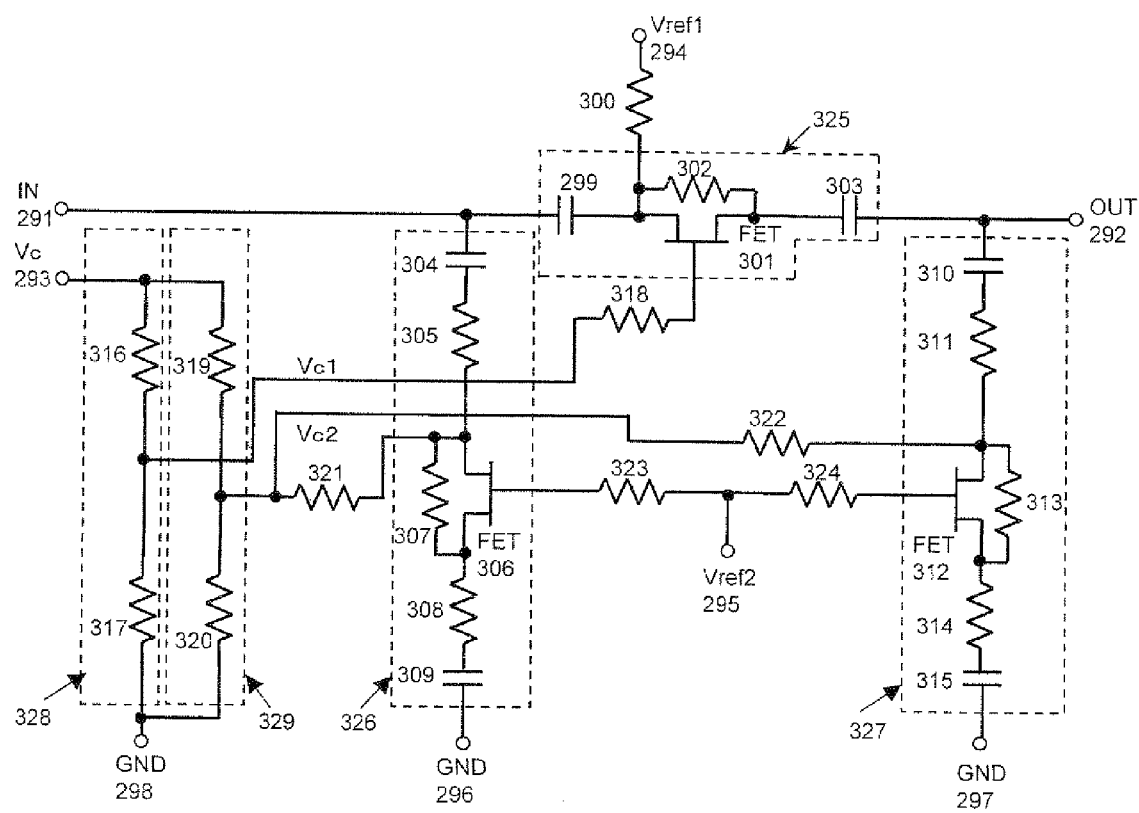
FIG. 6 is a circuit diagram showing the circuit configuration of a gain control circuit in a high frequency amplifier circuit according to Embodiment 2 of the invention.

FIG. 6 is a detailed circuit diagram showing the gain control circuit of FIG. 5. In FIG. 6, a signal input terminal (IN) 291 corresponding to the input terminal of the gain control circuit 273 is connected to one end of a capacitor 299 and to one end of a capacitor 304. The other end of the capacitor 299 is connected to the source terminal of an FET 301, to one end of a resistor 300, and to one end of a resistor 302.

The other end of the resistor 300 is connected to a reference voltage terminal (Vref1) 294 corresponding to the terminal 273b of the gain control circuit 273. The other end of the resistor 302 is connected to the drain terminal of the FET 301 and to one end of a capacitor 303. A signal output terminal (OUT) 292 corresponding to the output terminal of the gain control circuit 273 is connected to the other end of the capacitor 303 and to one end of a capacitor 310.

The other end of the capacitor 304 is connected to one end of a resistor 305. The other end of the resistor 305 is connected to the source terminal of an FET 306, to one end of a resistor 307, and to one end of a resistor 321. The drain terminal of the FET 306 is connected to the other end of the resistor 307 and to one end of a resistor 308. One end of a capacitor 309 is connected to the other end of the resistor 308. A GND terminal 296 corresponding to the terminal 273e of the gain control circuit 273 is connected to the other end of the capacitor 309.

The other end of the capacitor 310 is connected to one end of a resistor 311. The other end of the resistor 311 is connected to the source terminal of an FET 312, to one end of a resistor 313, and to one end of a resistor 322. The drain terminal of the FET 312 is connected to the other end of the resistor 313 and to one end of a resistor 314. One end of a capacitor 315 is connected to the other end of the resistor 314. A GND terminal 297 corresponding to the terminal 273 of the gain control circuit 273 is connected to the other end of the capacitor 315.

A reference voltage terminal (Vref2) 295 corresponding to the terminal 273c of the gain control circuit 273 is connected to one end of a resistor 323 and to one end of a resistor 324. The other end of the resistor 323 is connected to the gate terminal of the FET 306. The other end of the resistor 324 is connected to the gate terminal of the FET 312.

A control terminal (Vc) 293 corresponding to the terminal 273a of the gain control circuit 273 is connected to one end of a resistor 316 and to one end of a resistor 319. The other end of the resistor 316 is connected to one end of a resistor 317 and to one end of a resistor 318. The other end of the resistor 318 is connected to the gate terminal of the FET 301. The other end of the resistor 319 is connected to one end of a resistor 320, to the other end of the resistor 321, and to the other end of the resistor 322. A GND terminal 298 corresponding to the terminal 273d of the gain control circuit 273 is connected to the other end of the resistor 317 and to the other end of the resistor 320.

The circuit composed of the capacitor 299, the FET 301, the resistor 302, and the capacitor 303 connected between the signal input terminal 291 and the signal output terminal 292 is referred to as a variable resistor circuit 325. The circuit composed of the capacitor 304, the resistor 305, the FET 306, the resistor 307, the resistor 308, and the capacitor 309 connected between the signal input terminal 291 and the GND terminal 296 is referred to as a variable resistor circuit 326. The circuit composed of the capacitor 310, the resistor 311, the FET 312, the resistor 313, the resistor 314, and the capacitor 315 connected between the signal output terminal 292 and the GND terminal 297 is referred to as a variable resistor circuit 327.

Further, the circuit composed of the control terminal 293, the resistor 316, the resistor 317, and the GND terminal 298 is referred to as a voltage divider circuit 328. The circuit composed of the control terminal 293, the resistor 319, the resistor 320, and the GND terminal 298 is referred to as a voltage divider circuit 329.

In the FETs 301, 306, and 312, the positions of the source terminal and the drain terminal may be interchanged.

Further, the order of connection of the capacitor 304 and the resistor 305 and the order of connection of the resistor 308 and the capacitor 309 may be reversed. Furthermore, the order of connection of the capacitor 310 and the resistor 311 and the order of connection of the resistor 314 and the capacitor 315 may be reversed.

In this example, one end of the resistor 300 is connected to the source terminal of the FET 301 and to one end of the resistor 302. However, the one end of the resistor 300 may be connected to the drain terminal of the FET 301 and to the other end of the resistor 302. Further, one end of the resistor 321 is connected to the source terminal of the FET 306 and to one end of the resistor 307. However, the one end of the resistor 321 may be connected to the drain terminal of the FET 306 and to the other end of the resistor 307. One end of the resistor 322 is connected to the source terminal of the FET 312 and to one end of the resistor 313. However, the one end of the resistor 322 may be connected to the drain terminal of the FET 312 and to the other end of the resistor 313.

The operation of the high frequency amplifier circuit having such configuration according to the present embodiment is described below.

The operation of the FETs as variable resistors in the gain control circuit of FIG. 6 is described below briefly. The relation between the control voltage Vc of the control terminal 293, the reference voltage Vref1 of the reference voltage terminal 294, and the reference voltage Vref2 of the reference voltage terminal 295 is set into a predetermined situation, so that the resistance between the source terminal and the drain terminal of each of the FETs 301, 306, and 312 is adjusted. By virtue of this, the amount of attenuation is adjusted between the signal input terminal 291 and the signal output terminal 292, so that gain control is performed in the high frequency amplifier circuit.

Here, it is assumed that the resistors 300, 302, 307, 313, 318, 321, 322, 323, and 324 have a high resistance, and that almost no voltage drop occurs between the terminals of each resistor.

In the case that the FETs serve as variable resistors in the circuit of FIG. 6, the voltage of the control terminal 293 onto which a control voltage is applied is denoted by Vc. The voltage of the reference voltage terminal 294 is denoted by Vref1, while the voltage of the reference voltage terminal 295 is denoted by Vref2. At that time, the gate terminal of the FET 301 has almost the same potential as the voltage Vc1 generated by dividing the voltage Vc of the control terminal 293 by means of the resistors 316 and 317, while the source terminal and the drain terminal of the FET 301 have almost the same potential as the voltage Vref1 of the reference voltage terminal 294.

The source terminal and the drain terminal of the FET 306 have almost the same potential as the voltage Vc2 generated by dividing the voltage Vc of the control terminal 293 by means of the resistors 319 and 320, while the gate terminal of the FET 306 has almost the same potential as the voltage Vref2 of the reference voltage terminal 295.

The source terminal and the drain terminal of the FET 312 have almost the same potential as the voltage Vc2 generated by dividing the voltage Vc of the control terminal 293 by means of the resistors 319 and 320, while the gate terminal of the FET 312 has almost the same potential as the voltage Vref2 of the reference voltage terminal 295.

When a signal is inputted to the source terminal of the FETs 301, 306, and 312, the Dower ratio of the signal inputted to the source terminal of the FETs 301, 306, and 312 to the signal outputted from the drain terminal is summarized as a function of the control voltage and the reference voltage, as follows.

(FET 301)
When $Vc1 > Vref1$,
the source-drain is in the low impedance range.
When $Vc1 < Vref1 - |Vth|$,
the source-drain is in the high impedance range.
When $Vref1 - |Vth| \leq Vc1 \leq Vref1$,
the source-drain is in the variable resistor range.

(FETs 306 and 312)

When Vc2<Vref2,
the source-drain is in the low impedance range.
When Vc2>Vref2+|Vth|,
the source-drain is in the high impedance range.
When Vref2≦Vc2≦Vref2+|Vth|,
the source-drain is in the variable resistor range.

Here, Vth indicates the threshold voltage of the FETs 301, 306, and 312.

Described below is the operation when the gain control circuit in the circuit of FIG. 6 is applied in a high frequency circuit block of a multiband mobile communication terminal. In this example, the following operation conditions are assumed. The frequencies of two kinds of signals to be inputted through the signal input terminal 291 are 940 MHz and 1.95 GHz. The voltage (Vref1) applied to the reference voltage terminal 294 is 0.9 V, while the voltage (Vref2) applied to the reference voltage terminal 295 is 0.55 V. The voltage applied to the control terminal 293 ranges from 0 V to 3 V. The resistors 305, 308, 311, and 314 have a resistance of 10Ω. The resistor 302 has a resistance of 500Ω. The capacitors 299, 303, 304, 309, 310, and 315 have a capacitance of 100 pF. The FETs 301, 306, and 312 have a threshold voltage Vth of −0.6 V. The resistor 316 has a resistance of 35 kΩ. The resistor 317 has a resistance of 10 kΩ. The resistor 319 has a resistance of 10 kΩ. The resistor 320 has a resistance of 10 kΩ. The resistors other than those mentioned here have a high resistance ranging from a few kΩ to a few hundreds kΩ.

Figure 7:
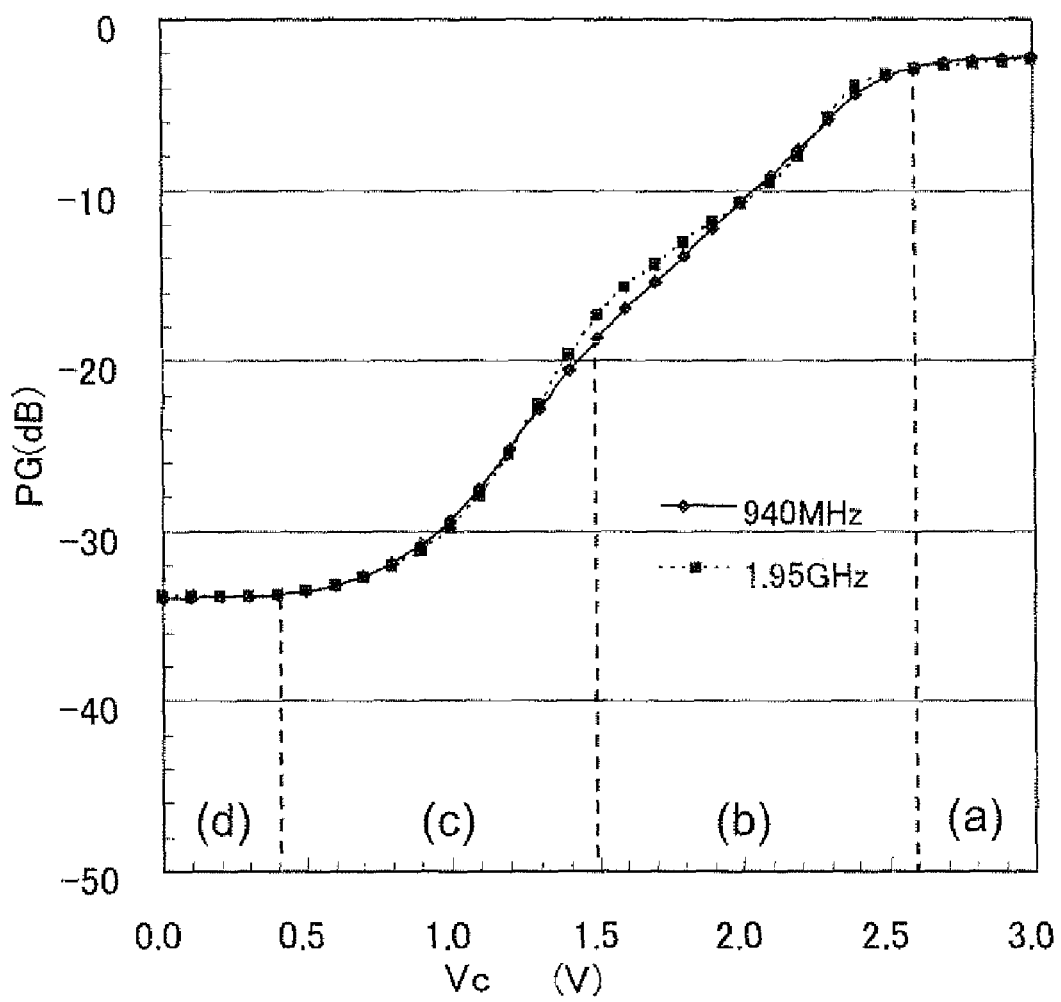
FIG. 7 is a graph showing the state of a gain control circuit in a high frequency amplifier circuit according to Embodiment 2 of the invention.

FIG. 7 shows the relation between the control voltage Vc and the ratio PG of the output cower of the signal output terminal 292 to the input power of the signal input terminal 291 in the gain control circuit of FIG. 6.

When the voltage on the control terminal 293 is at 2.6 V or higher (range a in FIG. 7), the FET 301 is in the low impedance state, while the FETs 306 and 312 are in the high impedance state. Thus, the amount of attenuation for the signal is small in the gain control circuit. Further, the amount of attenuation is constant independently of a change in the control voltage.

When the voltage on the control terminal 293 is at 1.5 V or higher and below 2.6 V (range b in FIG. 7), the FET 301 is in the low impedance state, while the FETs 306 and 312 are in the state that the amount of attenuation decreases with increasing gain control voltage. Thus, the amount of attenuation in the gain control circuit varies depending on the control voltage.

When the FET 306 in the variable resistor circuit 326 is in the low impedance state, and at the same time the FET 312 in the variable resistor circuit 327 is in the low impedance state, the amount of attenuation becomes maximum in the gain control circuit. Here, it should be noted that the impedance of the variable resistor circuit 326 does not go at or below the impedance of a series circuit of the capacitor 304, the resistor 305, the resistor 308, and the capacitor 309. Similarly, the impedance of the variable resistor circuit 327 does not go at or below the impedance of a series circuit of the capacitor 310, the resistor 311, the resistor 314, and the capacitor 315.

At the frequency of the signal inputted to the gain control circuit, when the capacitance values of the capacitors 304, 309, 310, and 315 are set such that their impedance values are negligible small, so that these capacitors serve as coupling capacitors for blocking the DC components, the amounts of attenuation in the variable resistor circuits 326 and 327 are determined by the resistors 305, 308, 311, and 314. This reduces the frequency dependence in the variable resistor circuits 326 and 327.

When the voltage on the control terminal 293 is at 0.4 V or higher and below 1.5 V (range c in FIG. 7), the FET 301 is in the state that the amount of attenuation decreases with increasing gain control voltage. The FETs 306 and 312 are in the low impedance state. Thus, the amount of attenuation in the gain control circuit varies depending on the control voltage.

When the FET 301 in the variable resistor circuit 325 is in the high impedance state, the amount of attenuation becomes maximum in the gain control circuit. Here, it should be noted that the impedance of the variable resistor circuit 325 does not reach or exceed the impedance of a series circuit of the capacitor 299, the resistor 302, and the capacitor 303.

At the frequency of the signal inputted to the gain control circuit, when the capacitance values of the capacitors 299 and 303 are set such that their impedance values are negligible small, so that these capacitors serve as coupling capacitors for blocking the DC components, the amount of attenuation in the variable resistor circuit 325 is determined by the resistor 302. This reduces the frequency dependence in the variable resistor circuit 325.

When the voltage on the control terminal 293 is at 0 V or higher and below 0.4 V (range d in FIG. 7), the FET 301 is in the high impedance state, while the FETs 306 and 312 are in the low impedance state. Thus, the amount of attenuation in the gain control circuit is large and constant independently of a change in the control voltage.

The present example has been described for the case that the resistors 305 and 308 in the variable resistor circuit 326 and the resistors 311 and 314 in the variable resistor circuit 327 have a resistance of 10Ω. However, the present invention is not limited to this value. That is, it is sufficient that such resistors are inserted into the variable resistor circuits 326 and 327. Thus, the circuit configuration and the resistance values of the variable resistor circuits 326 and 327 may be adjusted flexibly depending on the circuit layout.

FIG. 7 shows experimental results for the two frequencies of 940 MHz and 1.95 GHz inputted to the gain control circuit. As seen from this figure illustrating the relation between the gain control voltage and the amount of attenuation, frequency dependent variation in the gain control characteristics is notably reduced.

As such, in the gain control circuit of FIG. 6, two kinds of reference voltages are set in the gain control circuit. Then, the FET 301 inserted in series to a signal line formed between the signal input terminal 291 and the signal output terminal 292 and the FETs 306 and 312 inserted in parallel (in a shunt position) to the signal line formed between the signal input terminal 291 and the signal output terminal 292 are operated in a state that their operation ranges are shifted. This allows a single control terminal to control the amount of attenuation in the gain control circuit across a wider gain control voltage range and a wider frequency range.

Further, in the present embodiment, a voltage divider circuit 328 is provided that divides the voltage Vc of the control terminal 293 by means of the resistors 316 and 317. Then, the voltage Vc1 generated by the voltage divider circuit 328 is provided through the resistor 318 to the gate terminal of the FET 301. Similarly, a voltage divider circuit 329 is provided that divides the voltage Vc of the control terminal 293 by means of the resistors 319 and 320. Then, the voltage Vc2 generated by the voltage divider circuit 329 is provided through the resistor 321 to the gate terminal of the FET 306, as well as through the resistor 324 to the gate terminal of the FET 312. This allows the gain control voltage to be set across a wider range of the control voltage. This permits the use of an ordinary resolution D/A converter in the control circuit for controlling the gain control circuit, and hence avoids complexity in the control circuit.

Further, in the gain control circuit of FIG. 5, the reference voltage terminal 281 can be shared with the supply terminal 282 or 283. This reduces the number of terminals in the high frequency amplifier circuit, and hence reduces the area size of the high frequency amplifier circuit assembly.

Furthermore, in the gain control circuit of FIG. 6, when a multigate FET which has a plurality of gate electrodes between the source electrode and the drain electrode is used as each FET in the gain control circuit, distortion characteristics for the signal level inputted to the FET is improved without the necessity of increasing the gate width.

Further, in the gain control circuit of FIG. 6, any one of the variable resistor circuits 326 and 327 inserted in parallel (in a shunt position) to the signal line may be omitted. This simplifies the configuration of the variable resistor circuits. And still, as for the relation between the gain control voltage and the amount of attenuation, frequency dependent variation in the gain control characteristics is notably reduced to an extent similar to the case that the variable resistor circuits 326 and 327 are both used. Furthermore, this configuration allows a single control terminal to control the amount of attenuation in the gain control circuit across a wider gain control voltage range and a wider frequency range.

What is claimed is:

1. A high frequency amplifier circuit comprising:
   a signal input terminal and a signal output terminal;
   a first matching circuit an input terminal of which is connected to said signal input terminal;
   a gain control circuit an input terminal of which is connected to an output terminal of said first matching circuit;
   a first amplifier an input terminal of which is connected to an output terminal of said gain control circuit;
   a second matching circuit an input terminal of which is connected to an output terminal of said first amplifier;
   a second amplifier an input terminal of which is connected to an output terminal of said second matching circuit;
   a third matching circuit an input terminal of which is connected to an output terminal of said second amplifier, and an output terminal of which is connected to said signal output terminal;
   a reference voltage terminal;
   a reference voltage circuit a reference voltage input terminal of which is connected to said reference voltage terminal, and a plurality of reference voltage output terminals of which are connected respectively to a plurality of reference voltage input terminals of said gain control circuit;
   a control terminal connected to a control input terminal of said gain control circuit;
   first ground terminals connected to ground terminals of said gain control circuit;
   a first supply terminal connected to a supply terminal of said first amplifier;
   a second ground terminal connected to a ground terminal of said first amplifier;
   a second supply terminal connected to a supply terminal of said second amplifier; and
   a third ground terminal connected to a ground terminal of said second amplifier, wherein:
   on the basis of the relation between the voltage of said reference voltage input terminal and the voltage of said control terminal, the resistance value between the signal input terminal and the signal output terminal of said gain control circuit is adjusted, so that the signal level on said signal output terminal is continuously adjusted relative to the signal level inputted to said signal input terminal.

2. A high frequency amplifier circuit according to claim 1, wherein said gain control circuit comprises a variable resistor circuit constructed from a field effect transistor.

3. A high frequency amplifier circuit according to claim 1, wherein said reference voltage terminal is connected either to said first supply terminal or to said second supply terminal.

4. A high frequency amplifier circuit comprising:
   a signal input terminal and a signal output terminal;
   a first matching circuit an input terminal of which is connected to said signal input terminal;
   a gain control circuit which has a voltage divider circuit for dividing a gain control voltage, and an input terminal of which is connected to an output terminal of said first matching circuit;
   a first amplifier an input terminal of which is connected to an output terminal of said gain control circuit;
   a second matching circuit an input terminal of which is connected to an output terminal of said first amplifier;
   a second amplifier an input terminal of which is connected to an output terminal of said second matching circuit;
   a third matching circuit an input terminal of which is connected to an output terminal of said second amplifier, and an output terminal of which is connected to said signal output terminal;
   a reference voltage terminal;
   a reference voltage circuit a reference voltage input terminal of which is connected to said reference voltage terminal, and a plurality of reference voltage output terminals of which are connected respectively to a plurality of reference voltage input terminals of said gain control circuit;
   a control terminal connected to a control input terminal of said gain control circuit;
   a first ground terminal connected to a ground terminal of said voltage divider circuit in said gain control circuit;
   second ground terminals connected to ground terminals of said gain control circuit;
   a first supply terminal connected to a supply terminal of said first amplifier;
   a third ground terminal connected to a ground terminal of said first amplifier;
   a second supply terminal connected to a supply terminal of said second amplifier; and
   a fourth ground terminal connected to a ground terminal of said second amplifier, wherein:
   on the basis of the relation between the voltage of said reference voltage input terminal and the voltage of said control terminal, the resistance value between the signal input terminal and the signal output terminal of said gain control circuit is adjusted, so that the signal level on said signal output terminal is continuously adjusted relative to the signal level inputted to said signal input terminal.

5. A high frequency amplifier circuit according to claim 4, wherein said gain control circuit comprises a variable resistor circuit constructed from a field effect transistor.

6. A high frequency amplifier circuit according to claim 4, wherein said reference voltage terminal is connected either to said first supply terminal or to said second supply terminal.

7. A mobile communication terminal a high frequency circuit block of which comprises: a transmitting section for transmitting a high frequency signal; a receiving section for receiving a high frequency signal; a synthesizer section; and a shared device section, wherein:

said transmitting section comprises: an up converter for converting a modulation signal having an intermediate frequency into a transmission frequency signal; a variable gain high frequency amplifier circuit having a gain control circuit and amplifying the output signal of said up converter; a high frequency switch a common terminal of which is connected to the output terminal of said variable gain high frequency amplifier circuit and which switches the high frequency signal path depending on the transmission frequency; a first band pass filter an input terminal of which is connected to one switching terminal of said high frequency switch, and which extracts a signal in a first transmission band; a first high power high frequency amplifier circuit having a fixed gain and amplifying a high frequency signal outputted from said first band pass filter; a first isolator for providing the output of said first high power high frequency amplifier circuit to said shared device section; a second band pass filter an input terminal of which is connected to the other switching terminal of said high frequency switch, and which extracts a signal in a second transmission band; a second high power high frequency amplifier circuit having a fixed gain and amplifying a high frequency signal outputted from said second band pass filter; and a second isolator for providing the output of said second high power high frequency amplifier circuit to said shared device section, and wherein:

said gain control circuit of said variable gain high frequency amplifier circuit comprises:

a signal input terminal and a signal output terminal, a first variable resistor circuit connecting said signal input terminal to said signal output terminal;

a second variable resistor circuit connected in parallel to said signal input terminal and a first ground terminal;

a third variable resistor circuit connected in parallel to said signal output terminal and a second ground terminal;

a first voltage divider circuit which is connected between a control terminal and a third ground terminal and an output terminal of which is connected to said first variable resistor circuit;

a second voltage divider circuit which is connected between said control terminal and said third ground terminal and an output terminal of which is connected respectively to said second and third variable resistor circuits;

a first reference voltage terminal connected to said first variable resistor circuit; and a second reference voltage terminal connected to said second and third variable resistor circuits, wherein:

the DC resistance between said signal input terminal and said signal output terminal is infinity;

the DC resistance between said signal input terminal and said first ground terminal is infinity;

the DC resistance between said signal output terminal and said second ground terminal is infinity; and on the basis of the relation between the voltage of said control terminal, the voltage of said first reference voltage terminal, and the voltage of said second reference voltage terminal, the resistance values of said first, second, and third variable resistor circuits are adjusted continuously, so that the signal level on said signal output terminal is continuously adjusted relative to the signal level inputted to said signal input terminal.

8. A mobile communication terminal a high frequency circuit block of which comprises: a transmitting section for transmitting a high frequency signal; a receiving section for receiving a high frequency signal; a synthesizer section; and a shared device section, wherein:

said transmitting section comprises: an up converter for converting a modulation signal having an intermediate frequency into a transmission frequency signal; a variable gain high frequency amplifier circuit having a gain control circuit and amplifying the output signal of said up converter; a high frequency switch a common terminal of which is connected to the output terminal of said variable gain high frequency amplifier circuit, and which switches the high frequency signal path depending on the transmission frequency; a first band pass filter an input terminal of which is connected to one switching terminal of said high frequency switch, and which extracts a signal in a first transmission band; a first high power high frequency amplifier circuit having a fixed gain and amplifying a high frequency signal outputted from said first band pass filter; a first isolator for providing the output of said first high power high frequency amplifier circuit to said shared device section; a second band pass filter an input terminal of which is connected to the other switching terminal of said high frequency switch, and which extracts a signal in a second transmission band; a second high power high frequency amplifier circuit having a fixed gain and amplifying a high frequency signal outputted from said second band pass filter; and a second isolator for providing the output of said second high power high frequency amplifier circuit to said shared device section, and wherein:

said gain control circuit of said variable gain high frequency amplifier circuit comprises:

a signal input terminal and a signal output terminal;

a first variable resistor circuit connecting said signal input terminal to said signal output terminal;

a second variable resistor circuit in parallel to said signal input terminal and a first ground terminal;

a first voltage divider circuit which is connected between a control terminal and a third ground terminal and an output terminal of which is connected to said first variable resistor circuit;

a second voltage divider circuit which is connected between said control terminal and said third ground terminal and an output terminal of which is connected to said second variable resistor circuit;

a first reference voltage terminal connected to said first variable resistor circuit; and a second reference voltage terminal connected to said second variable resistor circuit, wherein:

the DC resistance between said signal input terminal and said signal output terminal is infinity;

the DC resistance between said signal input terminal and said first ground terminal is infinity;

on the basis of the relation between the voltage of said control terminal, the voltage of said first reference voltage terminal, and the voltage of said second reference voltage terminal, the resistance values of said first and second variable resistor circuits are adjusted continuously, so that the signal level on said signal output terminal is continuously adjusted relative to the signal level inputted to said signal input terminal.

9. A mobile communication terminal a high frequency circuit block of which comprises: a transmitting section for transmitting a high frequency signal; a receiving section for receiving a high frequency signal; a synthesizer section; and a shared device section, wherein:

said transmitting section comprises: an up converter for converting a modulation signal having an intermediate frequency into a transmission frequency signal; a variable gain high frequency amplifier circuit having a gain control circuit and amplifying the output signal of said up converter; a high frequency switch a common terminal of which is connected to the output terminal of said variable gain high frequency amplifier circuit), and which switches the high frequency signal path depending on the transmission frequency; a first band pass filter an input terminal of which is connected to one switching terminal of said high frequency switch, and which extracts a signal in a first transmission band; a first high power high frequency amplifier circuit having a fixed gain and amplifying a high frequency signal outputted from said first band pass filter; a first isolator for providing the output of said first high power high frequency amplifier circuit to said shared device section; a second band pass filter an input terminal of which is connected to the other switching terminal of said high frequency switch, and which extracts a signal in a second transmission band; a second high power high frequency amplifier circuit having a fixed gain and amplifying a high frequency signal outputted from said second band pass filter; and a second isolator for providing the output of said second high power high frequency amplifier circuit to said shared device section, and wherein:

said gain control circuit of said variable gain high frequency amplifier circuit comprises:

a signal input terminal and a signal output terminal;

a first variable resistor circuit connecting said signal input terminal to said signal output terminal;

a third variable resistor circuit connected in parallel to said signal output terminal and a second ground terminal;

a first voltage divider circuit which is connected between a control terminal and a third ground terminal and an output terminal of which is connected to said first variable resistor circuit;

a second voltage divider circuit which is connected between said control terminal and said third ground terminal and an output terminal of which is connected to said third variable resistor circuit;

a first reference voltage terminal connected to said first variable resistor circuit; and a second reference voltage terminal connected to said third variable resistor circuit, wherein:

the DC resistance between said signal input terminal and said signal output terminal is infinity;

the DC resistance between said signal output terminal and said second ground terminal is infinity; and on the basis of the relation between the voltage of said control terminal, the voltage of said first reference voltage terminal, and the voltage of said second reference voltage terminal, the resistance values of said first and third variable resistor circuits are adjusted continuously, so that the signal level on said signal output terminal is continuously adjusted relative to the signal level inputted to said signal input terminal.

10. A mobile communication terminal according to claim 7, wherein:

said first variable resistor circuit comprises a first field effect transistor, while said first voltage divider circuit comprises at least two first resistors;

said control terminal is connected to said first voltage divider circuit, while the output terminal of said first voltage divider circuit is connected through at least one or more second resistors to the gate terminal of said first field effect transistor;

said first reference voltage terminal is connected through at least one or more third resistors to the source terminal or the drain terminal of said first field effect transistor; and a fourth resistor is connected between the source terminal and the drain terminal of said first field effect transistor.

11. A mobile communication terminal according to claim 7, wherein:

said second variable resistor circuit comprises a second field effect transistor, while said second voltage divider circuit comprises at least two fifth resistors;

said control terminal is connected to said second voltage divider circuit, while the output terminal of said second voltage divider circuit is connected through at least one or more sixth resistors to the source terminal or the drain terminal of said second field effect transistor;

said second reference voltage terminal is connected through at least one or more seventh resistors to the gate terminal of said second field effect transistor;

an eighth resistor is connected between the source terminal and the drain terminal of said second field effect transistor; and ninth resistors are connected at least at one of a position between said signal input terminal and the source terminal or the drain terminal of said second field effect transistor and a position between said first ground terminal and the drain terminal or the source terminal of said second field effect transistor.

12. A mobile communication terminal according to claim 7, wherein:

said third variable resistor circuit comprises a third field effect transistor, while said second voltage divider circuit comprises at least two fifth resistors;

said control terminal is connected to said second voltage divider circuit, while the output terminal of said second voltage divider circuit is connected through at least one or more tenth resistors to the source terminal or the drain terminal of said third field effect transistor;

said second reference voltage terminal is connected through at least one or more eleventh resistors to the gate terminal of said third field effect transistor;

a twelfth resistor is connected between the source terminal and the drain terminal of said third field effect transistor; and thirteenth resistors are connected at least at one of a position between said signal output terminal and the source terminal or the drain terminal of said third field effect transistor and a position between said second ground terminal and the drain terminal or the source terminal of said third field effect transistor.

13. A mobile communication terminal according to claim 10, wherein said first field effect transistor comprises a source electrode and a drain electrode, and further comprises at least one or more gate electrodes between said source electrode and said drain electrode.

14. A mobile communication terminal according to claim 11, wherein said second field effect transistor comprises a source electrode and a drain electrode, and further comprises at least one or more gate electrodes between said source electrode and said drain electrode.

15. A mobile communication terminal according to claim 12, wherein said third field effect transistor comprises a source electrode and a drain electrode, and further comprises at least one or more gate electrodes between said source electrode and said drain electrode.

* * * * *